(12) United States Patent
Branch et al.

(10) Patent No.: US 11,405,014 B1
(45) Date of Patent: Aug. 2, 2022

(54) SOLID-STATE TUNING BEHAVIOR IN ACOUSTIC RESONATORS

(71) Applicant: National Technology & Engineering Solutions of Sandia, LLC, Albuquerque, NM (US)

(72) Inventors: Darren W. Branch, Albuquerque, NM (US); Christopher Nordquist, Albuquerque, NM (US); Matt Eichenfield, Albuquerque, NM (US); James Kenneth Douglas, Albuquerque, NM (US); Aleem Siddiqui, Albuquerque, NM (US); Thomas A. Friedmann, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 133 days.

(21) Appl. No.: 16/912,916

(22) Filed: Jun. 26, 2020

Related U.S. Application Data

(60) Provisional application No. 62/867,706, filed on Jun. 27, 2019.

(51) Int. Cl.
*H03H 9/02* (2006.01)
*H03H 9/13* (2006.01)

(52) U.S. Cl.
CPC .... *H03H 9/02338* (2013.01); *H03H 9/02039* (2013.01); *H03H 9/131* (2013.01); *H03H 9/133* (2013.01)

(58) Field of Classification Search
CPC .. H03H 9/02; H03H 9/02338; H03H 9/02039; H03H 9/131; H03H 9/133

USPC .................................................. 333/186, 187
See application file for complete search history.

(56) References Cited

U.S. PATENT DOCUMENTS

| | | | |
|---|---|---|---|
| 5,073,763 A | 12/1991 | Wright | |
| 6,367,305 B2 | 4/2002 | Dobbins et al. | |
| 6,777,855 B2 | 8/2004 | Bergmann et al. | |
| 7,173,360 B2 | 2/2007 | Hartmann et al. | |
| 7,385,334 B1 | 6/2008 | Olsson et al. | |
| 7,652,547 B1 | 1/2010 | Wittwer et al. | |
| 7,687,971 B2 * | 3/2010 | Stokes | H03H 9/25 310/313 B |
| 7,821,360 B2 * | 10/2010 | Yip | H03H 9/6413 333/193 |

(Continued)

FOREIGN PATENT DOCUMENTS

| | | | |
|---|---|---|---|
| JP | H066172 A | * | 1/1994 |
| JP | 8250661 A | * | 9/1996 |

OTHER PUBLICATIONS

Sveshnikov, B., "Universal modeling of the bulk acoustic wave devices", in IEEE International Frequency Control Symposium Joint with the 22nd European Frequency and Time forum, 2009, pp. 466-469.

(Continued)

*Primary Examiner* — Rakesh B Patel
*Assistant Examiner* — Jorge L Salazar, Jr.
(74) *Attorney, Agent, or Firm* — Samantha Updegraff; Medley, Behrens & Lewis, LLC; Madelynne J. Farber

(57) ABSTRACT

The present invention relates to tunable microresonators, as well as methods of designing and tuning such resonators. In particular, tuning includes applying an electrical bias to the resonator, thereby shifting the resonant frequency.

20 Claims, 15 Drawing Sheets

(56) References Cited

U.S. PATENT DOCUMENTS

| | | |
|---|---|---|
| 7,878,063 B1 | 2/2011 | Cular et al. |
| 8,436,509 B1 | 5/2013 | Branch |
| 8,497,747 B1 | 7/2013 | Wojciechowski et al. |
| 8,522,411 B1 | 9/2013 | Bouche et al. |
| 8,669,688 B1 | 3/2014 | Branch |
| 8,669,823 B1 | 3/2014 | Olsson et al. |
| 9,203,134 B1 | 12/2015 | Henry et al. |
| 9,270,281 B1 | 2/2016 | Wojciechowski et al. |
| 9,641,154 B2 | 5/2017 | Olsson et al. |
| 10,009,002 B1 | 6/2018 | Branch et al. |
| 10,148,244 B1 | 12/2018 | Henry et al. |
| 2017/0366165 A1* | 12/2017 | Shih .................. H03H 9/02976 |
| 2019/0326878 A1* | 10/2019 | Kakita .................. H01L 41/047 |

OTHER PUBLICATIONS

Bao, et al., "Barium strontium titanate thin film varactors for room-temperature microwave device applications", in Journal of Physics D: Applied Physics, Feb. 29, 2008, pp. 1-21.

Gong, et al., "Precision fabrication techniques and analysis on high-Q evanescent-mode resonators and filters of different geometries", in IEEE Transactions on Microwave Theory and Techniques, vol. 52, No. 11, Nov. 2004, pp. 2557-2566.

Nordquist, et al., "X-band RF MEMS tuned combline filter", in Electronics Letters, vol. 41, No. 2, Jan. 2005, pp. 76-77.

Liu, et al., "A 3.4-6.2 GHz Continuously tunable electrostatic MEMS resonator with quality factor of 460-530", in 2009 IEEE MTT-S International Microwave Symposium Digest, 2009, pp. 1149-1152.

Krupka, et al., "Electrodynamic study of YIG filters and resonators", in Scientific Reports, Oct. 4, 2016, pp. 1-9.

Nordquist, et al., "MEMS switching of contour-mode aluminum nitride resonators for switchable and reconfigurable radio frequency filters", in Journal of Micromechanics and Microengineering, vol. 26, No. 10, Aug. 31, 2016, pp. 1-11.

Aigner, R., "Tunable acoustic RF-filters: Discussion of requirements and potential physical embodiments", in the 40th European Microwave Conference, 2010, pp. 787-790.

Pijolat, et al., "Bias controlled electrostrictive longitudinal resonance in X-cut lithium niobate thin films resonator", in Applied Physics Letters, 2011, pp. 1-3.

Burkov, et al., "Calculation of thermostable directions and the influence of bias electric field on the propagation of the Lamb and SH waves in langasite single crystal plates", in 2010 IEFF International Ultrasonics Symposium, 2010, pp. 1853-1856.

Wang, et al., "Effect of DC bias field on the complex materials coefficients of piezoelectric resonators", in Sensors and Actuators A: Physical, vol. 109, Issue 1-2, Dec. 2003, pp. 149-155.

Frayssignes, et al., "Phase transformation in BST ceramics investigated by internal friction measurements", in Journal of the European Ceramic Society, vol. 25, Issue 13, Aug. 2005, pp. 3203-3206.

Olsson III, et al., "A high electromechanical coupling coefficient SH0 Lamb wave lithium niobate micromechanical resonator and a method for fabrication", in Sensors and Actuators A: Physical, vol. 209, Mar. 2014, pp. 183-190.

Branch, et al., "Investigation of a Solid-State Tuning Behavior in Lithium Niobate", in IEEE Transactions on Ultrasonics, Ferroelectrics, and Frequency Control, vol. 67, No. 2, Feb. 2020, pp. 365-373.

Wang, et al., "A compliance/stiffness matrix formulation of general Green's function and effective permittivity for piezoelectric multilayers", in IEEE Transactions on Ultrasonics, Ferroelectrics, and Frequency Control, vol. 51, No. 4, Apr. 2004, pp. 453-463.

Wang, et al., "Modeling of wave propagation in layered piezoelectric media by a recursive asymptotic method", in EEE Transactions on Ultrasonics, Ferroelectrics, and Frequency Control, vol. 51, No. 9, Sep. 2004, pp. 1060-1071.

Tan, E.L., "Hybrid compliance-stiffness matrix method for stable analysis of elastic wave propagation in multilayered anisotropic media", in the Journal of the Acoustical Society of America, vol. 119, No. 45, 2006, pp. 45-53.

Fahmy, et al., "Propagation of acoustic surface waves in multilayers: A matrix description", in Applied Physics Letters, 1973, pp. 495-497.

Kuznetsova, et al., "Investigation of acoustic waves in thin plates of lithium niobate and lithium tantalate", in IEEE Transactions on Ultrasonics, Ferroelectrics, and Frequency Control, vol. 48, No. 1, Jan. 2001, pp. 322-328.

Joshi, et al., "Electromechanical coupling coefficients of ultrasonic Lamb waves", in the Journal of the Acoustical Society of America, vol. 94, 1993, pp. 261-267.

Baumhauer, et al., "Nonlinear electroelastic equations for small fields superposed on a bias", in the Journal of the Acoustical Society of America, vol. 54, 1973, pp. 1017-1034.

Brugger, K., "Thermodynamic Definition of Higher Order Elastic Coefficients", in Physical Review Journals Archive, vol. 133, Issue 6A, Mar. 1964, pp. 1611-1612.

Mcmahon, D. H., Accoustic Second-Harmonic Generation in Piezoelectric Crystals, in the Journal of the Acoustic Society of America, vol. 44, 1968, pp. 1007-1013.

Burkov, et al., "Calculation of the dispersive characteristics of acoustic waves in piezoelectric layered structures under the effect of DC electric field", in IEEE Transactions on Ultrasonics, Ferroelectrics, and Frequency Control, vol. 59, No. 10, Oct. 2012, pp. 2331-2337.

Cho, et al., "Nonlinear, elastic, piezoelectric, electrostrictive, and dielectric constants of lithium niobate", in Journal of Applied Physics, vol. 61, 1987, pp. 875-887.

Chandrahalim, et al., "Fully-Differential Mechanically-coupled PZT-on-Silicon Filters", in 2008 IFFF International Ultrasonics Symposium Proceedings, 2008, pp. 713-716.

Koohi, et al., "Reconfigurable Radios Employing Ferroelectrics", in IEEE Microwave Magazine, May 2020, pp. 120-135.

Kolda, T. G., "Multilinear operators for higher-order decompositions", Sandia Report No. SAND2006-2081, Apr. 2006, 28 Pages.

Sorokin, et al., "Elastic nonlinearity and propagation of volume acoustic waves under conditions of homogeneous mechanical stresses in a La3Ga5SiO14 single crystal", in Physics of the Solid State, vol. 36, 1994, pp. 1545-1550.

Newnham, et al., "Electrostriction: nonlinear electromechanical coupling in solid dielectrics," in the Journal of Physical Chemistry B, vol. 101, 1997, pp. 10141-10150.

Nakagawa, et al., "Third-order elastic constants of lithium niobate", in Journal of Applied Physics, vol. 44, 1973, pp. 3969-3974.

Hickernell, et al., "Pulsed DC voltage breakdown between interdigital electrodes", in Ultrasonics Symposium, 1972, pp. 388-391.

Koohi, et al., "Intrinsically Switchable and Bandwidth Reconfigurable Ferroelectric Bulk Acoustic Wave Filters", in IEEE Transactions on Ultrasonics, Ferroelectrics, and Frequency Control, vol. 67, No. 5, May 5, 2020, pp. 1025-1032.

* cited by examiner

SOLID-STATE TUNING BEHAVIOR IN ACOUSTIC RESONATORS

RELATED APPLICATIONS

This application claims priority to U.S. Provisional Patent Application No. 62/867,706, filed on Jun. 27, 2019, and entitled "SOLID-STATE TUNING BEHAVIOR IN ACOUSTIC RESONATORS", the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to tunable microresonators, as well as methods of designing and tuning such resonators. In particular, tuning includes applying an electrical bias to the resonator, thereby shifting the resonant frequency.

BACKGROUND OF THE INVENTION

Radio frequency (RF) filters with adaptive properties (e.g., tunable center frequency and/or variable bandwidth) can be key for an adaptive communications system. Challenges arise in designing components having such adaptivity while maintaining high performance metrics.

SUMMARY OF THE INVENTION

Accordingly, the present invention relates, in part, to solid-state tuning of a resonator. In particular, a model was developed to understand the effect of an applied electric field on various nonlinear material constants of a piezoelectric material. Based on this model, particular propagation directions of acoustic waves in the material that could be maximally affected by an applied electrical bias can be determined. To experimentally test this model, a non-limiting resonator was fabricated to promote acoustic propagation along the determined direction and it was verified that application of an electrical bias altered its resonant frequency.

In an exemplary aspect, the present invention features a device including: a microresonator characterized by a first resonant frequency; and one or more first electrodes configured to apply an electrical bias to the microresonator, thereby providing the microresonator having a second resonant frequency that is different than the first resonant frequency. In some embodiments, the difference between the first resonant frequency and the second resonant frequency is of from about 5% (e.g., of from about 0.1% to about 5%, including from 0.1% to 0.5%, 0.1% to 1%, 0.1% to 1.5%, 0.1% to 2%, 0.1% to 2.5%, 0.1% to 3%, 0.1% to 3.5%, 0.1% to 4%, 0.1% to 4.5%, 0.2% to 0.5%, 0.2% to 1%, 0.2% to 1.5%, 0.2% to 2%, 0.2% to 2.5%, 0.2% to 3%, 0.2% to 3.5%, 0.2% to 4%, 0.2% to 4.5%, 0.2% to 5%, 0.3% to 0.5%, 0.3% to 1%, 0.3% to 1.5%, 0.3% to 2%, 0.3% to 2.5%, 0.3% to 3%, 0.3% to 3.5%, 0.3% to 4%, 0.3% to 4.5%, 0.3% to 5%, 0.4% to 0.5%, 0.4% to 1%, 0.4% to 1.5%, 0.4% to 2%, 0.4% to 2.5%, 0.4% to 3%, 0.4% to 3.5%, 0.4% to 4%, 0.4% to 4.5%, 0.4% to 5%, 0.5% to 1%, 0.5% to 1.5%, 0.5% to 2%, 0.5% to 2.5%, 0.5% to 3%, 0.5% to 3.5%, 0.5% to 4%, 0.5% to 4.5%, 0.5% to 5%, 0.6% to 1%, 0.6% to 1.5%, 0.6% to 2%, 0.6% to 2.5%, 0.6% to 3%, 0.6% to 3.5%, 0.6% to 4%, 0.6% to 4.5%, 0.6% to 5%, 0.7% to 1%, 0.7% to 1.5%, 0.7% to 2%, 0.7% to 2.5%, 0.7% to 3%, 0.7% to 3.5%, 0.7% to 4%, 0.7% to 4.5%, 0.7% to 5%, 0.8% to 1%, 0.8% to 1.5%, 0.8% to 2%, 0.8% to 2.5%, 0.8% to 3%, 0.8% to 3.5%, 0.8% to 4%, 0.8% to 4.5%, 0.8% to 5%, 0.9% to 1%, 0.9% to 1.5%, 0.9% to 2%, 0.9% to 2.5%, 0.9% to 3%, 0.9% to 3.5%, 0.9% to 4%, 0.9% to 4.5%, 0.9% to 5%, 1% to 1.5%, 1% to 2%, 1% to 2.5%, 1% to 3%, 1% to 3.5%, 1% to 4%, 1% to 4.5%, 1% to 5%, 1.5% to 2%, 1.5% to 2.5%, 1.5% to 3%, 1.5% to 3.5%, 1.5% to 4%, 1.5% to 4.5%, 1.5% to 5%, 2% to 2.5%, 2% to 3%, 2% to 3.5%, 2% to 4%, 2% to 4.5%, 2% to 5%, 2.5% to 3%, 2.5% to 3.5%, 2.5% to 4%, 2.5% to 4.5%, 2.5% to 5%, 3% to 3.5%, 3% to 4%, 3% to 4.5%, 3% to 5%, 3.5% to 4%, 3.5% to 4.5%, 3.5% to 5%, 4% to 4.5%, 4% to 5%, or 4.5% to 5%).

In some embodiments, the microresonator further includes: a resonating portion including a piezoelectric material (e.g., any of such materials described herein); and the one or more first electrodes are further configured to provide an acoustic wave having a first propagation direction in the piezoelectric material. In further embodiments, the electrical bias includes an electric field that is sufficiently parallel or sufficiently antiparallel to the first propagation direction (e.g., the difference between the first propagation direction and a direction of the electric field is of from about 0.1° to about 20°, including from about 0.1° to 1°, 0.1° to 2°, 0.1° to 3°, 0.1° to 4°, 0.1° to 5°, 0.1° to 6°, 0.1° to 7°, 0.1° to 8°, 0.1° to 9°, 0.1° to 10°, 0.1° to 12°, 0.1° to 14°, 0.1° to 16°, 0.1° to 18°, 0.1° to 20°, 0.2° to 1°, 0.2° to 2°, 0.2° to 3°, 0.2° to 4°, 0.2° to 5°, 0.2° to 6°, 0.2° to 7°, 0.2° to 8°, 0.2° to 9°, 0.2° to 10°, 0.2° to 12°, 0.2° to 14°, 0.2° to 16°, 0.2° to 18°, 0.2° to 20°, 0.5° to 1°, 0.5° to 2°, 0.5° to 3°, 0.5° to 4°, 0.5° to 5°, 0.5° to 6°, 0.5° to 7°, 0.5° to 8°, 0.5° to 9°, 0.5° to 10°, 0.5° to 12°, 0.5° to 14°, 0.5° to 16°, 0.5° to 18°, 0.5° to 20°, 0.8° to 1°, 0.8° to 2°, 0.8° to 3°, 0.8° to 4°, 0.8° to 5°, 0.8° to 6°, 0.8° to 7°, 0.8° to 8°, 0.8° to 9°, 0.8° to 10°, 0.8° to 12°, 0.8° to 14°, 0.8° to 16°, 0.8° to 18°, 0.8° to 20°, 1° to 2°, 1° to 3°, 1° to 4°, 1° to 5°, 1° to 6°, 1° to 7°, 1° to 8°, 1° to 9°, 1° to 10°, 1° to 12°, 1° to 14°, 1° to 16°, 1° to 18°, 1° to 20°, 1.5° to 2°, 1.5° to 3°, 1.5° to 4°, 1.5° to 5°, 1.5° to 6°, 1.5° to 7°, 1.5° to 8°, 1.5° to 9°, 1.5° to 10°, 1.5° to 12°, 1.5° to 14°, 1.5° to 16°, 1.5° to 18°, 1.5° to 20°, 2° to 3°, 2° to 4°, 2° to 5°, 2° to 6°, 2° to 7°, 2° to 8°, 2° to 9°, 2° to 10°, 2° to 12°, 2° to 14°, 2° to 16°, 2° to 18°, 2° to 20°, 2.5° to 3°, 2.5° to 4°, 2.5° to 5°, 2.5° to 6°, 2.5° to 7°, 2.5° to 8°, 2.5° to 9°, 2.5° to 10°, 2.5° to 12°, 2.5° to 14°, 2.5° to 16°, 2.5° to 18°, 2.5° to 20°, 3° to 4°, 3° to 5°, 3° to 6°, 3° to 7°, 3° to 8°, 3° to 9°, 3° to 10°, 3° to 12°, 3° to 14°, 3° to 16°, 3° to 18°, 3° to 20°, 3.5° to 4°, 3.5° to 5°, 3.5° to 6°, 3.5° to 7°, 3.5° to 8°, 3.5° to 9°, 3.5° to 10°, 3.5° to 12°, 3.5° to 14°, 3.5° to 16°, 3.5° to 18°, 3.5° to 20°, 4° to 5°, 4° to 6°, 4° to 7°, 4° to 8°, 4° to 9°, 4° to 10°, 4° to 12°, 4° to 14°, 4° to 16°, 4° to 18°, 4° to 20°, 4.5° to 5°, 4.5° to 6°, 4.5° to 7°, 4.5° to 8°, 4.5° to 9°, 4.5° to 10°, 4.5° to 12°, 4.5° to 14°, 4.5° to 16°, 4.5° to 18°, 4.5° to 20°, 5° to 6°, 5° to 7°, 5° to 8°, 5° to 9°, 5° to 10°, 5° to 12°, 5° to 14°, 5° to 16°, 5° to 18°, 5° to 20°, 6° to 7°, 6° to 8°, 6° to 9°, 6° to 10°, 6° to 12°, 6° to 14°, 6° to 16°, 6° to 18°, 6° to 20°, 7° to 8°, 7° to 9°, 7° to 10°, 7° to 12°, 7° to 14°, 7° to 16°, 7° to 18°, 7° to 20°, 8° to 9°, 8° to 10°, 8° to 12°, 8° to 14°, 8° to 16°, 8° to 18°, 8° to 20°, 9° to 10°, 9° to 12°, 9° to 14°, 9° to 16°, 9° to 18°, 9° to 20°, 10° to 12°, 10° to 14°, 10° to 16°, 10° to 18°, 10° to 20°, 12° to 14°, 12° to 16°, 12° to 18°, 12° to 20°, 14° to 16°, 14° to 18°, 14° to 20°, 16° to 18°, 16° to 20°, or 18° to 20°).

In some embodiments, the propagation direction (e.g., direction a) is characterized by an angle ψ between the propagation direction a and an axis of the piezoelectric material (e.g., such as an X-axis, Y-axis, and/or Z-axis).

In other embodiments, the propagation direction (e.g., direction a) is characterized by an angle ψ between a rotation director n and an axis of the piezoelectric material (e.g., such as an X-axis, Y-axis, and/or Z-axis). In some embodiments, the propagation direction (e.g., direction a) is parallel to a rotation director n.

In some embodiments, the microresonator further includes: a resonating portion including a piezoelectric material; and one or more second electrodes configured to provide an acoustic wave having a first propagation direction in the piezoelectric material. In further embodiments, the one or more first electrodes are configured to apply the electrical bias including an electric field that is sufficiently parallel or sufficiently antiparallel to the first propagation direction. In particular embodiments, the electric field and the first propagation direction is sufficiently parallel or sufficiently antiparallel, such that the difference between the first propagation direction and a direction of the electric field is of from about 0.1° to about 20° (e.g., including any ranges described herein).

In any embodiment herein, the electrical bias is greater than about $1 \cdot 10^6$ V/m (e.g., from $1 \cdot 10^6$ V/m to $1 \cdot 10^7$ V/m, $1 \cdot 10^6$ V/m to $2 \cdot 10^7$ V/m, $1 \cdot 10^6$ V/m to $5 \cdot 10^7$ V/m, $1 \cdot 10^6$ V/m to $1 \cdot 10^8$ V/m, $1 \cdot 10^6$ V/m to $2 \cdot 10^8$ V/m, $1 \cdot 10^6$ V/m to $5 \cdot 10^8$ V/m, $2 \cdot 10^6$ V/m to $1 \cdot 10^7$ V/m, $2 \cdot 10^6$ V/m to $2 \cdot 10^7$ V/m, $2 \cdot 10^6$ V/m to $5 \cdot 10^7$ V/m, $2 \cdot 10^6$ V/m to $1 \cdot 10^8$ V/m, $2 \cdot 10^6$ V/m to $2 \cdot 10^8$ V/m, $2 \cdot 10^6$ V/m to $5 \cdot 10^8$ V/m, $5 \cdot 10^6$ V/m to $1 \cdot 10^7$ V/m, $5 \cdot 10^6$ V/m to $2 \cdot 10^7$ V/m, $5 \cdot 10^6$ V/m to $5 \cdot 10^7$ V/m, $5 \cdot 10^6$ V/m to $1 \cdot 10^8$ V/m, $5 \cdot 10^6$ V/m to $2 \cdot 10^8$ V/m, $5 \cdot 10^6$ V/m to $5 \cdot 10^8$ V/m, $1 \cdot 10^7$ V/m to $2 \cdot 10^7$ V/m, $1 \cdot 10^7$ V/m to $5 \cdot 10^7$ V/m, $1 \cdot 10^7$ V/m to $1 \cdot 10^8$ V/m, $1 \cdot 10^7$ V/m to $2 \cdot 10^8$ V/m, $1 \cdot 10^7$ V/m to $5 \cdot 10^8$ V/m, $2 \cdot 10^7$ V/m to $5 \cdot 10^7$ V/m, $2 \cdot 10^7$ V/m to $1 \cdot 10^8$ V/m, $2 \cdot 10^7$ V/m to $2 \cdot 10^8$ V/m, $2 \cdot 10^7$ V/m to $5 \cdot 10^8$ V/m, $5 \cdot 10^7$ V/m to $1 \cdot 10^8$ V/m, $5 \cdot 10^7$ V/m to $2 \cdot 10^8$ V/m, $5 \cdot 10^7$ V/m to $5 \cdot 10^8$ V/m, $1 \cdot 10^8$ V/m to $5 \cdot 10^8$ V/m, or $2 \cdot 10^8$ V/m to $5 \cdot 10^8$ V/m).

In some embodiments, the one or more first and/or second electrodes are located on a top surface and/or a bottom surface of the piezoelectric material. In other embodiments, the one or more first electrodes are located on a top surface, and the one or more second electrodes are located on a bottom surface of the piezoelectric material. In some embodiments, the one or more first electrodes are located on a top surface and a bottom surface of the piezoelectric material. In other embodiments, the one or more second electrodes are located on a top surface and a bottom surface of the piezoelectric material.

In some embodiments, the one or more first electrodes are located on a top surface of the piezoelectric material. In other embodiments, the one or more first electrodes are located on a bottom surface of the piezoelectric material. In yet other embodiments, the second electrodes are located on the top surface of the piezoelectric material. In other embodiments, the second electrodes are located on the bottom surface of the piezoelectric material.

In another aspect, the present invention features a tunable device including: a resonating portion including a piezoelectric material; one or more electrodes disposed in proximity to the resonating portion, wherein the one or more electrodes (e.g., first electrodes) provides an acoustic wave having a first propagation direction in the piezoelectric material; and an electrical bias that is applied to the resonating portion, wherein the electrical bias includes an electric field that is sufficiently parallel or sufficiently antiparallel to the first propagation direction.

In some embodiments, the one or more electrodes (e.g., first electrodes) are configured to provide the electrical bias.

In some embodiments, the electrical bias is configured to change a resonant frequency of the device upon changing an amount of electrical bias.

In a further aspect, the present invention features a die including a plurality of devices (e.g., any described herein, such as a resonator or a microresonator). In some embodiments, two or more of the devices are the same or different.

In still another aspect, the present invention features a method of designing a tunable resonator, the method including: determining a controlling coefficient α (e.g., as defined below by Eq. 10) and an electromechanical coupling coefficient $K^2$ for a plurality of propagation directions for an acoustic wave in a piezoelectric material (e.g., in a single crystal of a piezoelectric material); and locating a first propagation direction having a maximum value of the controlling coefficient α and/or the electromechanical coupling coefficient $K^2$. Exemplary, non-limiting values for α and $K^2$ are provided herein.

In some embodiments, the method further includes: fabricating a resonator including a resonating portion and one or more electrodes disposed on a surface of the resonating portion, wherein the resonating portion includes a crystal cut configured to promote an acoustic wave to propagate along the first propagation direction; and applying an electrical bias by way of the one or more electrodes, wherein the electrical bias includes an electric field that is sufficiently parallel or sufficiently antiparallel to the first propagation direction. Exemplary, non-limiting crystal cuts include an X-cut or a Y-cut.

In some embodiments, the plurality of propagation directions are characterized by an angle ψ of a rotation director n from an axis of the piezoelectric material (e.g., such as a X-, Y-, and/or Z-axis).

In further aspects, the present invention features a method of tuning a microresonator, the method including: providing the microresonator characterized by a first resonant frequency; and applying an electrical bias to the microresonator, thereby providing the microresonator having a second resonant frequency that is different than the first resonant frequency. In some embodiments, the difference between the first resonant frequency and the second resonant frequency is about 5% (e.g., about 0.1% to about 5%, as well as any other range described herein).

In some embodiments, the microresonator further includes: a resonating portion including a piezoelectric material; and one or more first electrodes. In some embodiments, the one or more first electrodes are configured to apply the electrical bias to the microresonator and/or configured to provide an acoustic wave having a first propagation direction in the piezoelectric material. In other embodiments, the electrical bias includes an electric field that is sufficiently parallel or sufficiently antiparallel to the first propagation direction.

In some embodiments, the microresonator further includes: a resonating portion including a piezoelectric material; one or more first electrodes configured to provide the electrical bias to the microresonator; and one or more second electrodes configured to provide an acoustic wave having a first propagation direction in the piezoelectric material. In some embodiments, the electrical bias includes an electric field that is sufficiently parallel or sufficiently antiparallel to the first propagation direction.

In yet another aspect, the present invention features a band select filter array including a plurality of devices (e.g., resonators, microresonators, single crystal micromechanical resonators as well as any described herein). In some embodiments, two or more devices are the same or different.

In any embodiment herein, the device (e.g., resonator or microresonator) has a first resonant frequency defined by the plate width W, which is a photolithographically definable dimension of the device. The device can also include other lithographically definable resonator and electrode dimensions (e.g., any dimension described herein, such as resonator plate thickness t or electrode aperture a) that can be optimized to provide desired device characteristics.

In any embodiment herein, the device is configured to provide an acoustic wave having a first propagation direction by matching the crystal orientation with the type and direction of the acoustic wave (e.g., $SH_0$ or $S_0$) having a high electromechanical coupling coefficient $K^2$ for that orientation (or propagation direction) and/or having a high controlling coefficient α for that orientation (or propagation direction).

In any embodiment herein, the device (e.g., resonator or microresonator) further includes a plurality of electrodes disposed on a surface of the resonating portion. In particular embodiments, the surface is a top surface. In other embodiments, the surface is a bottom surface.

In any embodiment herein, the device is a Lamb wave microresonator. In other embodiments, the device is a shear mode Lamb wave resonator or a symmetric mode Lamb wave resonator.

In any embodiment herein, the device (e.g., resonator or microresonator) includes: a resonating portion including a piezoelectric material; and one or more first electrodes (e.g., configured to apply the electrical bias to the microresonator and/or configured to provide an acoustic wave having a first propagation direction in the piezoelectric material). In some embodiments, the electrical bias includes an electric field that is sufficiently parallel or sufficiently antiparallel to the first propagation direction.

In any embodiment herein, the device (e.g., resonator or microresonator) includes: a resonating portion including a piezoelectric material; one or more first electrodes (e.g., configured to apply the electrical bias to the microresonator); and one or more second electrodes (e.g., configured to provide an acoustic wave having a first propagation direction in the piezoelectric material). In some embodiments, the electrical bias includes an electric field that is sufficiently parallel or sufficiently antiparallel to the first propagation direction.

In any embodiment herein, the device (e.g., resonator or microresonator) further includes a support structure disposed below the resonating portion (e.g., wherein the resonating portion and the support structure are composed of a single crystal); and a plurality of anchoring regions configured to suspend the resonating portion within the support structure, wherein a trench is disposed below and around the resonating portion. In particular embodiments, the plurality of anchoring regions, resonating portion, and the support structure are composed of the same single crystal.

In any embodiment herein, the device includes a single crystal micromechanical resonator including a resonating portion that includes a single X-cut or Y-cut crystal of lithium niobate or lithium tantalate; a support structure disposed around or below the resonating portion, where the resonating portion and the support structure are composed of the same single X-cut or Y-cut crystal; and a plurality of anchoring regions configured to suspend the resonating portion within the support structure, where a trench is disposed below and/or around the resonating portion.

In any embodiment herein, the resonating portion includes a suspended plate.

In any embodiment herein, the acoustic wave is configured to propagate along the first propagation direction. Exemplary waves include a Lamb wave (e.g., characterized by any useful mode, such as a $S_0$ mode or a $SH_0$ mode).

In any embodiment herein, the first propagation direction is within an X-cut crystal (e.g., within a body of the crystal or along a surface of the crystal). Exemplary, non-limiting crystals include lithium niobate or lithium tantalate, as well as any other described herein.

In any embodiment herein, the first propagation direction is within a Y-cut crystal (e.g., within a body of the crystal or along a surface of the crystal). Exemplary, non-limiting crystals include lithium niobate or lithium tantalate, as well as any other described herein.

In any embodiment herein, the piezoelectric material includes an X-cut lithium niobate crystal, a Y-cut lithium niobate crystal, a Z-cut lithium niobate crystal, a rotated cut lithium niobate crystal, an X-cut lithium tantalate crystal, a Y-cut lithium tantalate crystal, a Z-cut lithium tantalate crystal, or a rotated-cut lithium tantalate crystal (e.g., a rotated X-, Y-, or Z-cut crystal, where the rotation can be of any useful angle, such as 0°, 60°, 136°, or 174°).

In any embodiment herein, the piezoelectric material has a thickness of from about 0.2 μm to about 10 μm (e.g., including from about 0.2 μm to 0.5 μm, 0.2 μm to 1 μm, 0.2 μm to 0.2 μm to 3 μm, 0.2 μm to 4 μm, 0.2 μm to 5 μm, 0.2 μm to 6 μm, 0.2 μm to 7 μm, 0.2 μm to 8 μm, 0.2 μm to 9 μm, 0.3 μm to 0.5 μm, 0.3 μm to 1 μm, 0.3 μm to 2 μm, 0.3 μm to 3 μm, 0.3 μm to 4 μm, 0.3 μm to 5 μm, 0.3 μm to 6 μm, 0.3 μm to 7 μm, 0.3 μm to 8 μm, 0.3 μm to 9 μm, 0.3 μm to 10 μm, 0.4 μm to 0.5 μm, 0.4 μm to 1 μm, 0.4 μm to 2 μm, 0.4 μm to 3 μmm 0.4 μm to 4 μm, 0.4 μm to 5 μmm 0.4 μm to 6 μm, 0.4 μm to 7 μm, 0.4 μm to 8 μm, 0.4 μm to 9 μm, 0.4 μm to 10 μm, 0.5 μm to 1 μm, 0.5 μm to 2 μm, 0.5 μm to 3 μm, 0.5 μm to 4 μm, 0.5 μm to 5 μm, 0.5 μm to 6 μm, 0.5 μm to 7 μm, 0.5 μm to 8 μm, 0.5 μm to 9 μm, 0.5 μm to 10 μm, 0.6 μm to 1 μm, 0.6 μm to 2 μm, 0.6 μm to 3 μm, 0.6 μm to 4 μm, 0.6 μm to 5 μm, 0.6 μm to 6 μm, 0.6 μm to 7 μm, 0.6 μm to 8 μm, 0.6 μm to 9 μm, 0.6 μm to 10 μm, 0.7 μm to 1 μm, 0.7 μm to 2 μm, 0.7 μm to 3 μm, 0.7 μm to 4 μm, 0.7 μm to 5 μm, 0.7 μm to 6 μm, 0.7 μm to 7 μm, 0.7 μm to 8 μm, 0.7 μm to 9 μm, 0.7 μm to 10 μm, 0.8 μm to 1 μm, 0.8 μm to 2 μm, 0.8 μm to 3 μm, 0.8 μm to 4 μm, 0.8 μm to 5 μm, 0.8 μm to 6 μm, 0.8 μm to 7 μm, 0.8 μm to 8 μm, 0.8 μm to 9 μm, 0.8 μm to 10 μm, 0.9 μm to 1 μm, 0.9 μm to 2 μm, 0.9 μm to 3 μm, 0.9 μm to 4 μm, 0.9 μm to 5 μm, 0.9 μm to 6 μm, 0.9 μm to 7 μm, 0.9 μm to 8 μm, 0.9 μm to 9 μm, 0.9 μm to 10 μm, 1 μm to 2 μm, 1 μm to 3 μm, 1 μm to 4 μm, 1 μm to 5 μm, 1 μm to 6 μm, 1 μm to 7 μm, 1 μm to 8 μm, 1 μm to 9 μm, 1 μm to 10 μm, 1.2 μm to 2 μm, 1.2 μm to 3 μm, 1.2 μm to 4 μm, 1.2 μm to 5 μm, 1.2 μm to 6 μm, 1.2 μm to 7 μm, 1.2 μm to 8 μm, 1.2 μm to 9 μm, 1.2 μm to 10 μm, 1.5 μm to 2 μm, 1.5 μm to 3 μm, 1.5 μm to 4 μm, 1.5 μm to 5 μm, 1.5 μm to 6 μm, 1.5 μm to 7 μm, 1.5 μm to 8 μm, 1.5 μm to 9 μm, 1.5 μm to 10 μm, 1.8 μm to 2 μm, 1.8 μm to 3 μm, 1.8 μm to 4 μm, 1.8 μm to 5 μm, 1.8 μm to 6 μm, 1.8 μm to 7 μm, 1.8 μm to 8 μm, 1.8 μm to 9 μm, 1.8 μm to 10 μm, 2 μm to 3 μm, 2 μm to 4 μm, 2 μm to 5 μm, 2 μm to 6 μm, 2 μm to 7 μm, 2 μm to 8 μm, 2 μm to 9 μm, 2 μm to 10 μm, 2.5 μm to 3 μm, 2.5 μm to 4 μm, 2.5 μm to 5 μm, 2.5 μm to 6 μm, 2.5 μm to 7 μm, 2.5 μm to 8 μm, 2.5 μm to 9 μm, 2.5 μm to 10 μm, 3 μm to 4 μm, 3 μm to 5 μm, 3 μm to 6 μm, 3 μm to 7 μm, 3 μm to 8 µm, 3 µm to 9 µm, 3 µm to 10 µm, 3.5 µm to 4 µm, 3.5 µm to 5 µm, 3.5 µm to 6 µm, 3.5 µm to 7 µm, 3.5 µm to 8 µm, 3.5 µm to 9 µm, 3.5 µm to 10 µm, 4 µm to 5 µm, 4 µm to 6 µm, 4 µm to 7 µm, 4 µm to 8 µm, 4 µm to 9 µm, 4 µm to 10 µm, 4.5 µm to 5 µm, 4.5 µm to 6 µm, 4.5 µm to 7 µm, 4.5 µm to 8 µm, 4.5 µm to 9 µm, 4.5 µm to 10 µm, 5 µm to 6 µm, 5 µm to 7 µm, 5 µm to 8 µm, 5 µm to 9 µm, 5 µm to 10 µm, 5.5 µm to 6 µm, 5.5 µm to 7 µm, 5.5 µm to 8 µm, 5.5 µm to 9 µm, 5.5 µm to 10 µm, 6 µm to 7 µm, 6 µm to 8 µm, 6 µm to 9 µm, 6 µm to 10 µm, 6.5 µm to 7 µm, 6.5 µm to 8 µm, 6.5 µm to 9 µm, 6.5 µm to 10 µm, 7 µm to 8 µm, 7 µm to 9 µm, 7 µm to 10 µm, 7.5 µm to 8 µm, 7.5 µm to 9 µm, 7.5 µm to 10 µm, 8 µm to 9 µm, 8 µm to 10 µm, 8.5 µm to 9 µm, 8.5 µm to 10 µm, or 9 µm to 10 µm).

In any embodiment herein, the piezoelectric material includes a single crystal having a cut that is characterized by a maximum value of a controlling coefficient $\alpha$ and/or a maximum value of an electromechanical coupling coefficient $K^2$, as compared to other cuts of the single crystal. In some embodiments, an absolute value of the controlling coefficient $\alpha$ is of from about $1 \cdot 10^{-11}$ m/V to about $20 \cdot 10^{-11}$ m/V (e.g., including from about $1 \cdot 10^{-11}$ m/V to $2 \cdot 10^{-11}$ m/V, $1 \cdot 10^{-11}$ m/V to $5 \cdot 10^{-11}$ m/V, $1 \cdot 10^{-11}$ m/V to $8 \cdot 10^{-11}$ m/V, $1 \cdot 10^{-11}$ m/V to $10 \cdot 10^{-11}$ m/V, $1 \cdot 10^{-11}$ m/V to $12 \cdot 10^{-11}$ m/V, $1 \cdot 10^{-11}$ m/V to $14 \cdot 10^{-11}$ m/V, $1 \cdot 10^{-11}$ m/V to $15 \cdot 10^{-11}$ m/V, $1 \cdot 10^{-11}$ m/V to $16 \cdot 10^{-11}$ m/V, $1 \cdot 10^{-11}$ m/V to $18 \cdot 10^{-11}$ m/V, $2 \cdot 10^{-11}$ m/V to $5 \cdot 10^{-11}$ m/V, $2 \cdot 10^{-11}$ m/V to $8 \cdot 10^{-11}$ m/V, $2 \cdot 10^{-11}$ m/V to $10 \cdot 10^{-11}$ m/V, $2 \cdot 10^{-11}$ m/V to $12 \cdot 10^{-11}$ m/V, $2 \cdot 10^{-11}$ m/V to $14 \cdot 10^{-11}$ m/V, $2 \cdot 10^{-11}$ m/V to $15 \cdot 10^{-11}$ m/V, $2 \cdot 10^{-11}$ m/V to $16 \cdot 10^{-11}$ m/V, $2 \cdot 10^{-11}$ m/V to $18 \cdot 10^{-11}$ m/V, $2 \cdot 10^{-11}$ m/V to $20 \cdot 10^{-11}$ m/V, $5 \cdot 10^{-11}$ m/V to $8 \cdot 10^{-11}$ m/V, $5 \cdot 10^{-11}$ m/V to $10 \cdot 10^{-11}$ m/V, $5 \cdot 10^{-11}$ m/V to $12 \cdot 10^{-11}$ m/V, $5 \cdot 10^{-11}$ m/V to $14 \cdot 10^{-11}$ m/V, $5 \cdot 10^{-11}$ m/V to $15 \cdot 10^{-11}$ m/V, $5 \cdot 10^{-11}$ m/V to $16 \cdot 10^{-11}$ m/V, $5 \cdot 10^{-11}$ m/V to $18 \cdot 10^{-11}$ m/V, $5 \cdot 10^{-11}$ m/V to $20 \cdot 10^{-11}$ m/V, $6 \cdot 10^{-11}$ m/V to $8 \cdot 10^{-11}$ m/V, $6 \cdot 10^{-11}$ m/V to $10 \cdot 10^{-11}$ m/V, $6 \cdot 10^{-11}$ m/V to $12 \cdot 10^{-11}$ m/V, $6 \cdot 10^{-11}$ m/V to $14 \cdot 10^{-11}$ m/V, $6 \cdot 10^{-11}$ m/V to $15 \cdot 10^{-11}$ m/V, $6 \cdot 10^{-11}$ m/V to $16 \cdot 10^{-11}$ m/V, $6 \cdot 10^{-11}$ m/V to $18 \cdot 10^{-11}$ m/V, $6 \cdot 10^{-11}$ m/V to $20 \cdot 10^{-11}$ m/V, $8 \cdot 10^{-11}$ m/V to $10 \cdot 10^{-11}$ m/V, $8 \cdot 10^{-11}$ m/V to $12 \cdot 10^{-11}$ m/V, $8 \cdot 10^{-11}$ m/V to $14 \cdot 10^{-11}$ m/V, $8 \cdot 10^{-11}$ m/V to $15 \cdot 10^{-11}$ m/V, $8 \cdot 10^{-11}$ m/V to $16 \cdot 10^{-11}$ m/V, $8 \cdot 10^{-11}$ m/V to $18 \cdot 10^{-11}$ m/V, $8 \cdot 10^{-11}$ m/V to $20 \cdot 10^{-11}$ m/V, $10 \cdot 10^{-11}$ m/V to $12 \cdot 10^{-11}$ m/V, $10 \cdot 10^{-11}$ m/V to $14 \cdot 10^{-11}$ m/V, $10 \cdot 10^{-11}$ m/V to $15 \cdot 10^{-11}$ m/V, $10 \cdot 10^{-11}$ m/V to $16 \cdot 10^{-11}$ m/V, $10 \cdot 10^{-11}$ m/V to $18 \cdot 10^{-11}$ m/V, $10 \cdot 10^{-11}$ m/V to $20 \cdot 10^{-11}$ m/V, $12 \cdot 10^{-11}$ m/V to $14 \cdot 10^{-11}$ m/V, $12 \cdot 10^{-11}$ m/V to $15 \cdot 10^{-11}$ m/V, $12 \cdot 10^{-11}$ m/V to $16 \cdot 10^{-11}$ m/V, $12 \cdot 10^{-11}$ m/V to $18 \cdot 10^{-11}$ m/V, $12 \cdot 10^{-11}$ m/V to $20 \cdot 10^{-11}$ m/V, $14 \cdot 10^{-11}$ m/V to $15 \cdot 10^{-11}$ m/V, $14 \cdot 10^{-11}$ m/V to $16 \cdot 10^{-11}$ m/V, $14 \cdot 10^{-11}$ m/V to $18 \cdot 10^{-11}$ m/V, $14 \cdot 10^{-11}$ m/V to $20 \cdot 10^{-11}$ m/V, $16 \cdot 10^{-11}$ m/V to $18 \cdot 10^{-11}$ m/V, $16 \cdot 10^{-11}$ m/V to $20 \cdot 10^{-11}$ m/V, or $18 \cdot 10^{-11}$ m/V to $20 \cdot 10^{-11}$ m/V). In other embodiments, the electromechanical coupling coefficient $K^2$ has a value of from about 5% to about 50% (e.g., including from about 5% to 10%, 5% to 15%, 5% to 20%, 5% to 25%, 5% to 30%, 5% to 35%, 5% to 40%, 5% to 45%, 10% to 15%, 10% to 20%, 10% to 25%, 10% to 30%, 10% to 35%, 10% to 40%, 10% to 45%, 10% to 50%, 12% to 15%, 12% to 20%, 12% to 25%, 12% to 30%, 12% to 35%, 12% to 40%, 12% to 45%, 12% to 50%, 15% to 20%, 15% to 25%, 15% to 30%, 15% to 35%, 15% to 40%, 15% to 45%, 15% to 50%, 18% to 20%, 18% to 25%, 18% to 30%, 18% to 35%, 18% to 40%, 18% to 45%, 18% to 50%, 20% to 25%, 20% to 30%, 20% to 35%, 20% to 40%, 20% to 45%, 20% to 50%, 25% to 30%, 25% to 35%, 25% to 40%, 25% to 45%, 25% to 50%, 30% to 35%, 30% to 40%, 30% to 45%, 30% to 50%, 35% to 40%, 35% to 45%, 35% to 50%, 40% to 50%, or 45% to 50%). Additional details follow.

Definitions

As used herein, the term "about" means +/−10% of any recited value. As used herein, this term modifies any recited value, range of values, or endpoints of one or more ranges.

By "micro" is meant having at least one dimension that is less than 1 mm and, optionally, equal to or larger than about 1 µm. For instance, a microstructure (e.g., any structure described herein) can have a length, width, height, cross-sectional dimension, circumference, radius (e.g., external or internal radius), or diameter that is less than 1 mm.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

DETAILED DESCRIPTION OF THE INVENTION

The present invention relates to a device having a characteristic (e.g., a resonant frequency) that can be tuned by applying an electric field. In particular embodiments, the applied electric field modulates one or more nonlinear material constants, such that the effective material properties of a piezoelectric material are modified, thereby providing a modified resonant frequency.

Figure 1A:
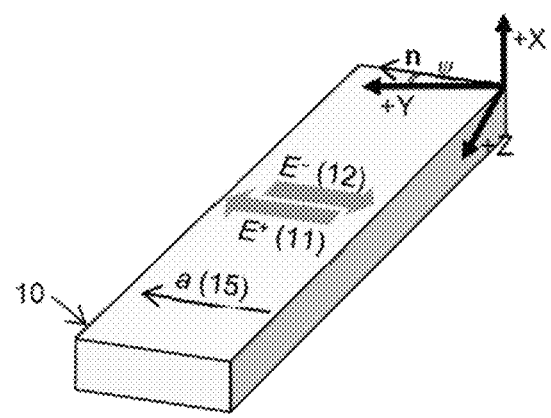
FIGS. 1A-1B show (A) a schematic showing the orientation of a resonating portion 10 having a propagation direction a 15 for an acoustic wave and an applied electric field E 11, 12 according to rotation angle ψ from the Y-axis; and (B) a schematic of an exemplary single resonator including a pair of interdigitated finger electrodes 20 disposed on a suspended region 25 of a piezoelectric crystal, in which the dc bias electric field was oriented −10° from the +Y-axis and parallel to the acoustic propagation direction.

FIG. 1A provides an exemplary resonating portion 10 of a device. In particular embodiments, the resonating portion includes a piezoelectric plate. The resonating portion can be configured to propagate an acoustic wave (e.g., a Lamb wave) through the piezoelectric material (e.g., along a surface of the material and/or through the material). The acoustic wave can be characterized by a propagation direction a 15 in the piezoelectric material, in which the propagation direction is defined in any useful way. In one embodiment, the propagation direction is defined by a rotation director on a particular cut of crystal (e.g., a rotation director of a vector n that is rotated from the Y-axis by an angle ψ in a particular crystal cut, such as an X-cut crystal, thereby providing Euler angles of (φ=90°, θ=90°, ψ); or any other useful rotation director or orientation based on Euler angles (φ, θ, ψ) using the Z-X-Z definition to rotate the material properties).

An electric field E can be applied to the resonating portion 10 in any useful manner. In one non-limiting instance, the electric field E is applied in a direction 11,12 that is sufficiently parallel or sufficiently antiparallel to the propagation direction a 15. In certain embodiments, a positive bias $E^+$ 11 is defined as a field that is sufficiently parallel to the propagation direction a 15. In other embodiments, a negative bias $E^-$ 12 is defined as a field that is sufficiently antiparallel to the propagation direction a 15.

Applying an electric field can result in a material change to a device. In one non-limiting embodiment, the device (e.g., a resonator) can be characterized by a first resonant frequency, and this first resonant frequency can be tuned by applying an electrical field, thereby shifting the first resonant frequency to a second resonant frequency that is different than the first resonant frequency.

Figure 1B:
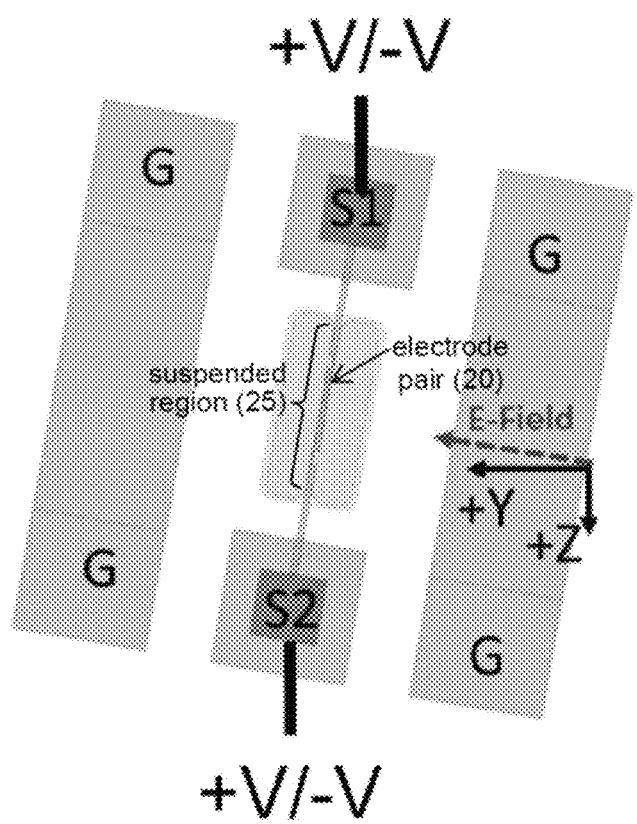

FIG. 1B provides an exemplary device (e.g., a resonator) having a suspended region 25 formed of a piezoelectric material and a pair of electrodes 20 disposed on a surface of the piezoelectric material. The location and/or configuration of the electrodes 20 controls the propagation characteristics of the acoustic wave. In addition, the behavior of the wave can be dependent on the crystallographic orientation of the piezoelectric material. For example, the propagation velocity of an acoustic wave in a material can depend on the particular crystallographic orientation of the material. For instance, and without limitation, an acoustic wave is generally driven between the gaps of electrodes, and the location of electrodes on a piezoelectric surface can be selected to promote propagation of waves along a desired crystal cut.

The resonating portion of a resonator device can include a particular orientation of electrodes (e.g., one or more electrodes or one or more electrode pairs) to initiate such acoustic waves. Furthermore, the electrodes can be configured to apply an electrical bias to the resonating portion. Propagation of the acoustic waves and application of an electrical bias can be accomplished by the same electrodes or different electrodes.

In the non-limiting device of FIG. 1B, the electrode pair 20 is employed both to propagate an acoustic wave and to apply an electrical bias. Other configurations could be employed. For instance, a first set of electrodes (e.g., first electrodes) can be configured to apply an electrical bias, and a second set of electrodes (e.g., second electrodes) can be configured to provide an acoustic wave through the resonating portion. In yet another instance, the location of the electrodes can be the same or different. In certain embodiments, the electrodes can be located on a top surface and/or bottom surface of the resonating portion. In one embodiment, the first and second sets are located on the top surface. In another embodiment, the first set is located on the top surface, and the second set is located on the bottom surface. Yet other structural configurations are possible, and yet other exemplary electrode configurations are further described herein.

Another useful configuration can include a particular crystal orientation, such as rotation or crystal cut (e.g., as characterized by rotation angles, such as ψ, from the X-axis, Y-axis, and Z-axis). Particularized crystal orientation can be selected to have beneficial properties, such as high controlling coefficient α (e.g., any values or ranges described herein) and/or a high electromechanical coupling coefficient $K^2$ (e.g., any values or ranges described herein).

Devices, Including Resonators

Various exemplary devices are described herein. In particular instances, the device is a micromechanical resonator (or microresonator) having a high electromechanical coupling coefficient $K^2$. In particular embodiments, the resonator includes a resonating portion, as well as one or more electrodes disposed on at least one surface of the resonating portion. In further embodiments, the resonator includes a support structure disposed below the resonating portion. In other embodiments, the resonating portion includes one or more anchoring regions, which suspend the resonating portion within the support structure. In yet other embodiments, the suspended resonating portion is surrounded by a trench, which separates the resonating portion and the support structure.

Figure 2A:
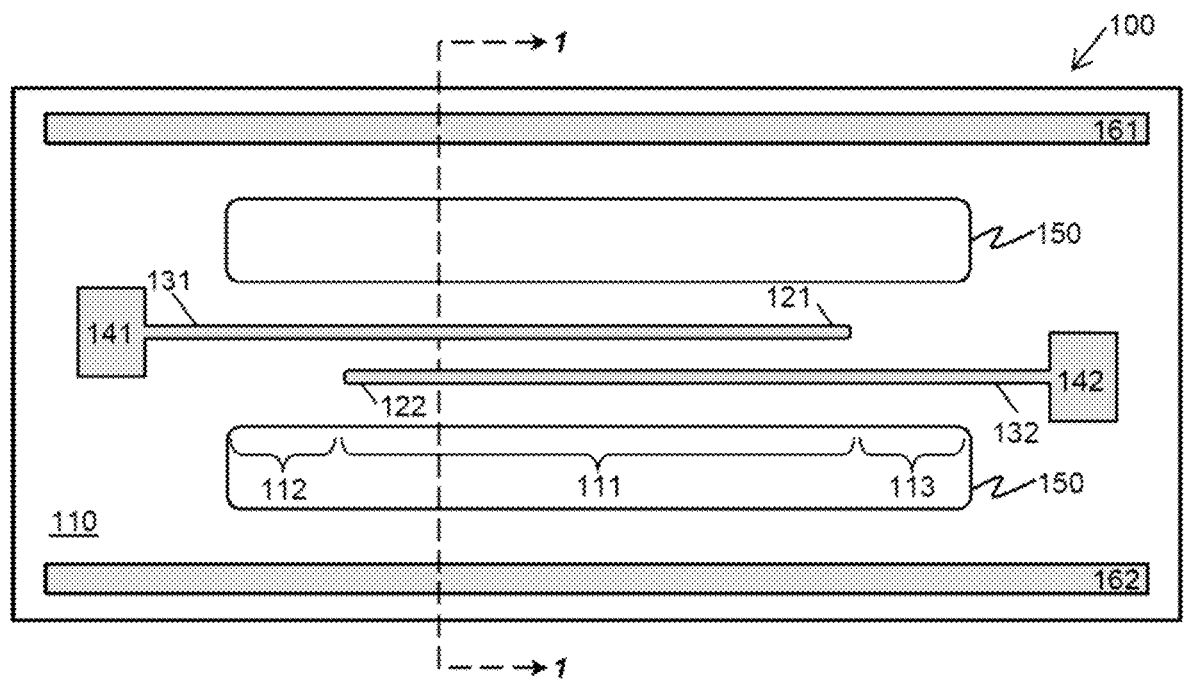
FIGS. 2A-2C show schematics of an exemplary microresonator. Provided are (A) a top-down view of an exemplary microresonator 100 having a plate suspended over a trench 150, (B) a cross-section view along section line 1-1, and (C) a perspective view showing various dimensions of the microresonator, including width W, length L, and thickness h of the resonating portion, as well as electrode gap g, electrode aperture a, electrode width e, and space between the electrode and the edge of the resonating portion s.
Figure 2B:
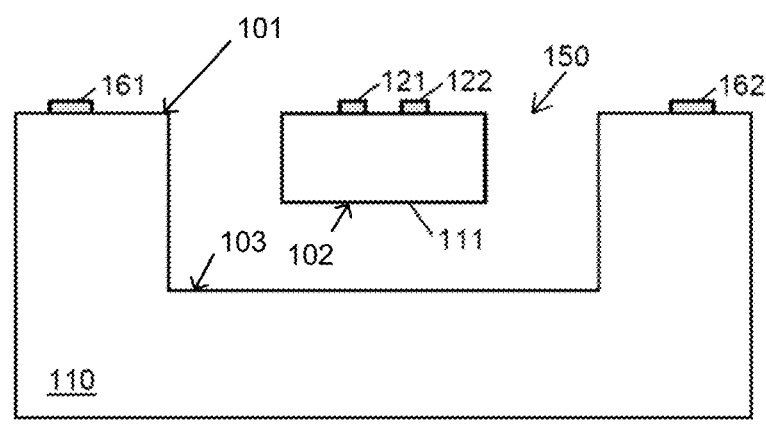

FIGS. 2A-2B show an exemplary microresonator 100. FIG. 2A is a top-down view of the microresonator 100. FIG. 2B is a sectional view of the microresonator 100 taken along line 1-1 depicted in FIG. 2A. As seen in FIG. 2A, the microresonator 100 includes a support structure 110, a resonating portion 111, and two anchoring regions 112, 113 configured to suspend the resonating portion 111 within the support structure 110. A pair of electrodes 121, 122 on the top surface of the resonating portion 111 is electrically connected to contact pads 141, 142, respectively, by wiring 131, 132. Ground electrodes 161, 162 are also disposed on a top face 101 of the microresonator 100. The electrodes can have any useful geometry (e.g., bars, interdigitated fingers, etc.) and useful location (e.g., on the top and/or bottom surfaces of the microresonator, resonating portion, and/or anchoring region(s)).

The resonating portion 111 can be suspended. For example, the microresonator 100 includes a trench 150, which is located between a bottom surface 102 of the resonating portion 111 and a surface 103 of the support structure 110. As seen in FIG. 2B, the trench 150 is disposed below and around the resonating portion 111. In this manner, the trench 150 acoustically isolates the suspended resonating portion 111 from the support structure 110. Additional isolation trenches can be included in the support structure.

Figure 2C:
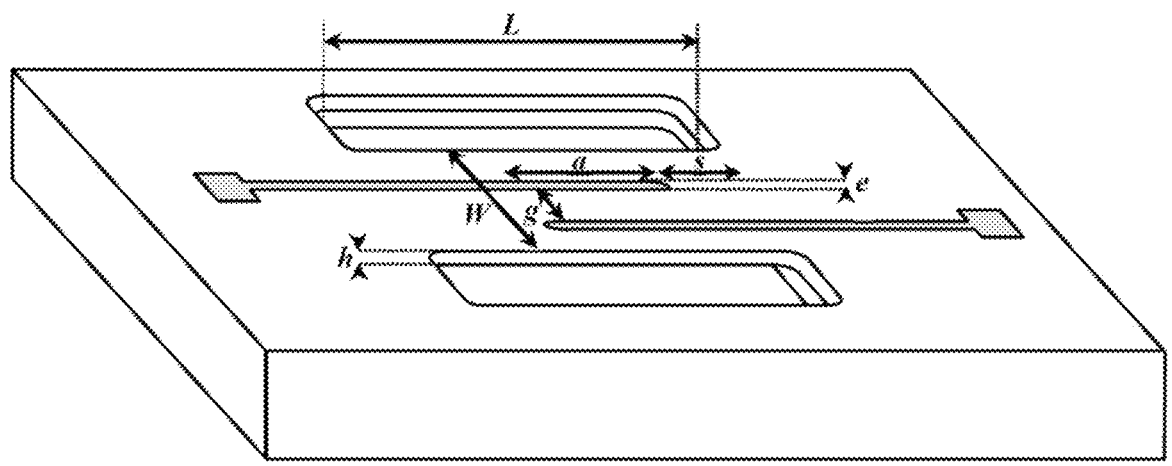

The resonating portion (e.g., the resonating portion 111) generally includes a single crystal of a piezoelectric material having any useful crystallographic cut (e.g., any described herein). The dimension(s) of the resonating portion can be selected to optimize the electromechanical coupling coefficient $K^2$, the resonant frequency $f_s$, and/or the quality factor Q. Exemplary dimensions include plate thickness h, width W, and length L (FIG. 2C). For instance, to promote particular modes within the resonator (e.g., the $SH_0$ or $S_0$ mode), the thickness-to-wavelength ratio $h/\lambda$ can be about 0.05. In yet other embodiments, $h/\lambda$ can be of from about 0.01 to about 0.5. The width W can be designed for a particular wavelength $\lambda$ (e.g., $\lambda=2$ W for a Lamb wave resonator) or for a particular resonant frequency $f_s=c/2$ W, where c is the relevant sound velocity within the resonating portion.

The anchoring region(s) (e.g., the anchoring regions 112, 113) connect the resonating portion to the support structure. In addition, the anchoring regions can be designed to suspend and isolate the resonating region. For instance, a microresonator can include thin, tapered anchoring regions that suspend the resonating portion above a trench that is located within the substrate or support structure. Exemplary structures for anchoring regions are described in U.S. Pat. No. 8,669,823, which is incorporated herein by reference in its entirety.

In another instance, the resonating region can be a rectangular region having four corners, and an anchoring region can be located on each of the corners to connect and suspend the resonating region above a trench (see, e.g., Gong S et al., "Design and analysis of lithium-niobate-based high electromechanical coupling RF-MEMS resonators for wideband filtering," *IEEE Trans. Microwave Theory Tech.* 2013 January; 61(1):403-14). Other design and material considerations can be incorporated into the geometry of the anchoring region in order to promote acoustic and/or thermal isolation. Further resonator designs are described in Olsson III R H et al., "A high electromechanical coupling coefficient SH0 Lamb wave lithium niobate micromechanical resonator and a method for fabrication," *Sens. Actuat.* A 2014; 209; 183-190, as well as U.S. Pat. Nos. 9,203,134, 9,270,281, 9,641,154, 10,009,002, and 10,148,244, each of which is incorporated herein by reference in its entirety.

One or more electrodes (e.g., the electrodes 121, 122) can be used to drive and/or sense the acoustic waves in the piezoelectric crystal. The electrode(s) can have any useful dimension and/or orientation. For instance, the electrode can have any useful electrode width e (e.g., about 5 µm), gap g between two electrodes (e.g., about 5 µm), aperture a (e.g., from about 20 µm to about 200 µm), and space s (e.g., from about 20 µm to about 200 µm) (see FIG. 2C). The electrode can be placed at any useful location of the resonating portion, such as on the top surface, bottom surface, and/or at or near the edge of the resonating portion. In some embodiments, the electrodes are centered on the resonating portion. Electrodes (e.g., input electrodes and output electrodes) can include any useful configuration, such as one or more finger electrodes or pair of interdigitated finger electrodes. Additional electrodes can be included (e.g., one or more ground electrodes, opposite polarity electrodes, or floating electrodes) on one or more surfaces of the resonating portion (e.g., the top and/or bottom surfaces) and/or the anchoring region(s).

The electrode can be electrically connected (e.g., by wiring) to one or more bond pads (e.g., contact pads and/or ground pads, such as contact pads 141, 142) to provide electrical input and output connections for the microresonator. Optionally, each electrode can be associated with a bus (e.g., an interconnect bus), and each electrode includes a plurality of fingers that extend orthogonally from the bus, which in turn is electrically connected to one or more bond pads.

The input and output electrodes can have any useful structure. In one instance, the input electrode includes a first interconnect bus that is employed to electrically connect the microresonator with another element. The input electrode can further include a first plurality of fingers that extend orthogonally from the first interconnect bus. Accordingly, fingers in the first plurality of fingers can be parallel with one another. The output electrode of the acoustic microresonator can include a second interconnect bus that is parallel to the first interconnect bus. Additionally, the first plurality of fingers and the first plurality of stubs can extend from the first interconnect bus towards the second interconnect bus.

Exemplary electrodes include a finger electrode (e.g., a single finger electrode, a double finger electrode, a split finger electrode, or a pruned double split finger electrode), an interdigitated transducer, a grating electrode, a thin film electrode, a bar electrode, a planar electrode, and/or a floating electrode having any useful thickness, period, material, or geometric arrangement (e.g., an interdigitated configuration, an arrayed configuration, a gate configuration, a one-port configuration, a two-port configuration, a delay line configuration, a unidirectional configuration, a bidirectional configuration, etc.) and formed by any useful process, such as sputtering, vacuum deposition, or electroplating. Exemplary electrodes are described in U.S. Pat. Nos. 5,073,763, 6,777,855, 7,173,360, 7,878,063, 8,436,509, 8,497,747, 8,522,411, 8,669,688, and 10,009,002, each of which is incorporated herein by reference in its entirety. Non-limiting materials for electrodes include a metal (e.g., an ohmic metal), a conductive material, an adhesion material, a metal oxide, an antioxidizing material, including multilayered and/or doped forms thereof. Yet other materials include aluminum (Al), titanium (Ti), titanium nitride (TiN), gold (Au), silver (Ag), copper (Cu), tungsten (W), molybdenum (Mo), platinum (Pt), ruthenium (Ru), tantalum (Ta), chromium (Cr), osmium (Os), rhenium (Re), iridium (Ir), as well as alloys, doped forms, and multilayers thereof (e.g., TiW/ AlCu or TiW/Cu layers). Arrays of n electrodes or n pairs of electrodes (e.g., n is 2, 4, 5, 10, 15, 20, 24, etc.) can also be incorporated with the microresonator of the invention. In particular embodiments, the electrode includes a lower resistive material to improve the quality factor and/or to operate at higher frequencies (e.g., any lower resistive material described herein, such as gold, silver, copper, aluminum, as well as doped forms thereof).

Embodiments described herein are applicable to various types of resonator. Exemplary resonators include a Lamb wave resonator having a plate resonating portion; a thickness mode acoustic wave resonator having longitudinal elastic waves traveling though the solid material; a contour mode resonator having a suspended resonating portion; as well as thickness-field excitation and lateral field excitation resonators thereof. In addition, the resonator can be optimized to promote symmetric modes, asymmetric modes, and/or shear modes of the acoustic wave propagating in the piezoelectric crystal. Spurious modes can be reduced by any useful method, such as by rotating bond/contact pads.

Figure 10A:
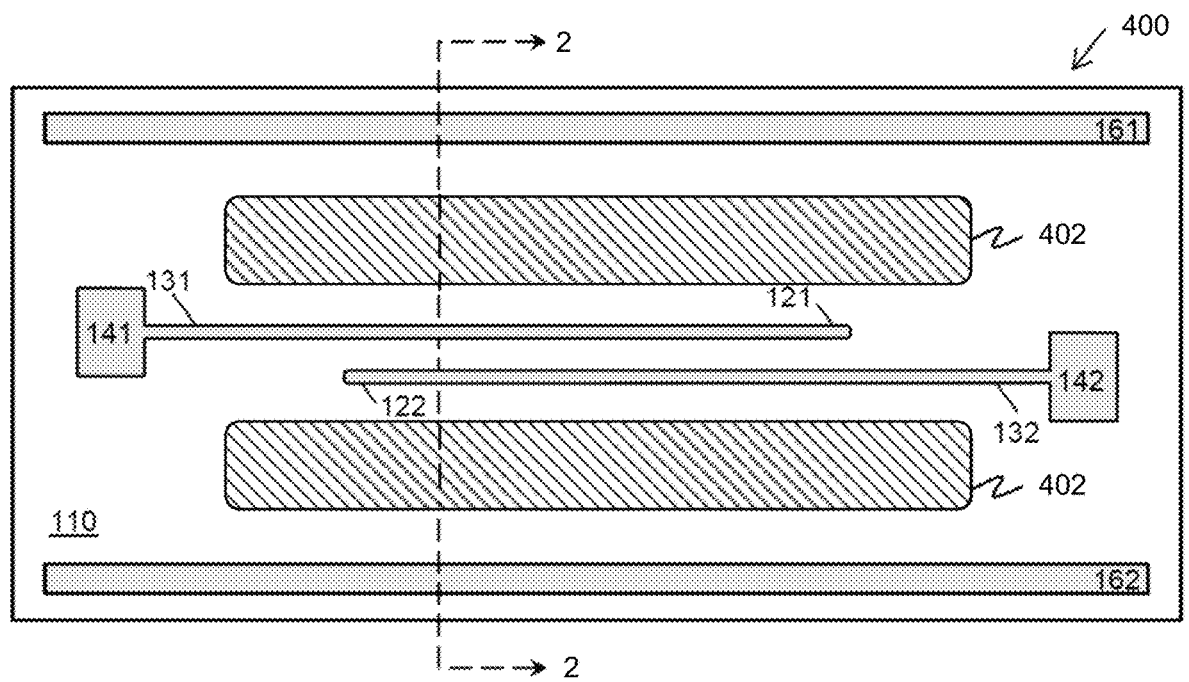
FIGS. 10A-10B show diagrams of another exemplary microresonator.
Figure 10B:
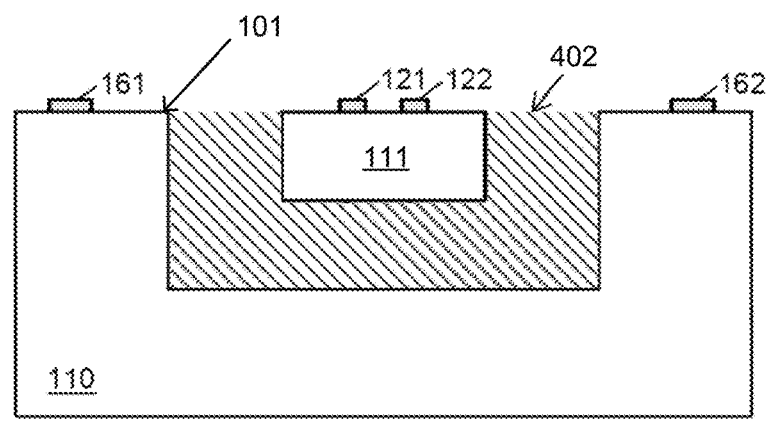

In various additional embodiments, rather than being suspended, the resonating portion 111 can be embedded in and/or surrounded by a substrate or acoustic insulating layer. In such embodiments, the substrate/insulating layer can provide sufficient acoustic isolation to prevent substantial propagation of an acoustic wave between the resonating portion 111 and the support structure 110. By way of example and referring now to FIGS. 10A and 10B, another exemplary microresonator 400 is shown, wherein the microresonator 400 includes an acoustic isolation element 402. FIG. 10A is a top-down view of the microresonator 400. FIG. 10B is a sectional view of the microresonator 400 taken along line 2-2 depicted in FIG. 10A. The microresonator 400 includes the resonating portion 111, electrodes 121, 122, wires 131, 132, pads 141, 142 and ground electrodes 161, 162. Rather than including a trench 150 over which the resonating portion 111 is suspended, the microresonator 400 includes the acoustic isolation element 402. In the microresonator 400, the resonating portion 111 is embedded in the acoustic isolation element 402 (e.g., surrounded by the acoustic isolation element 402 on three or more sides), rather than being suspended over a trench. The acoustic isolation element 402 acoustically isolates the resonating portion 111 from the support structure 110 without requiring formation of the trench 150. This can simplify fabrication of the microresonator 400 by obviating the need for lithographic processing steps used to form the trench 150. In exemplary embodiments, the acoustic isolation element 402 can be composed of silicon.

Figure 11A:
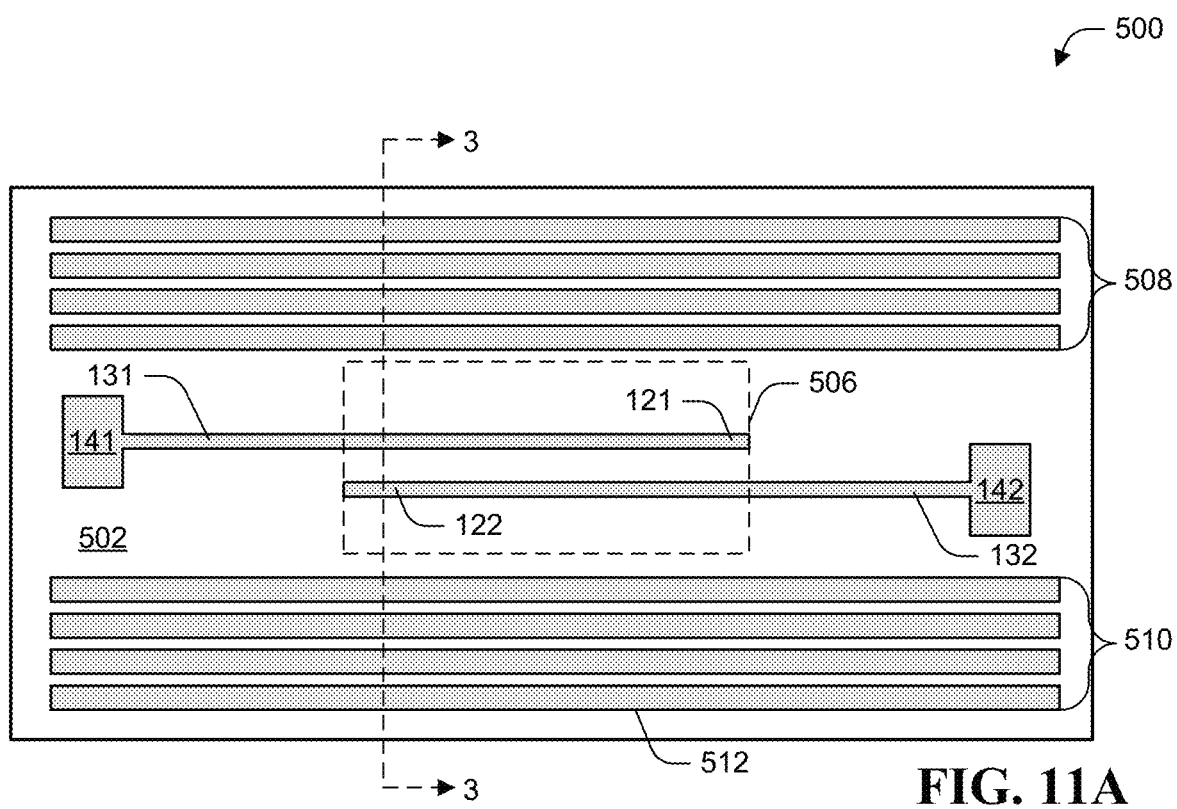
FIGS. 11A-11B show diagrams of still another exemplary microresonator.
Figure 11B:
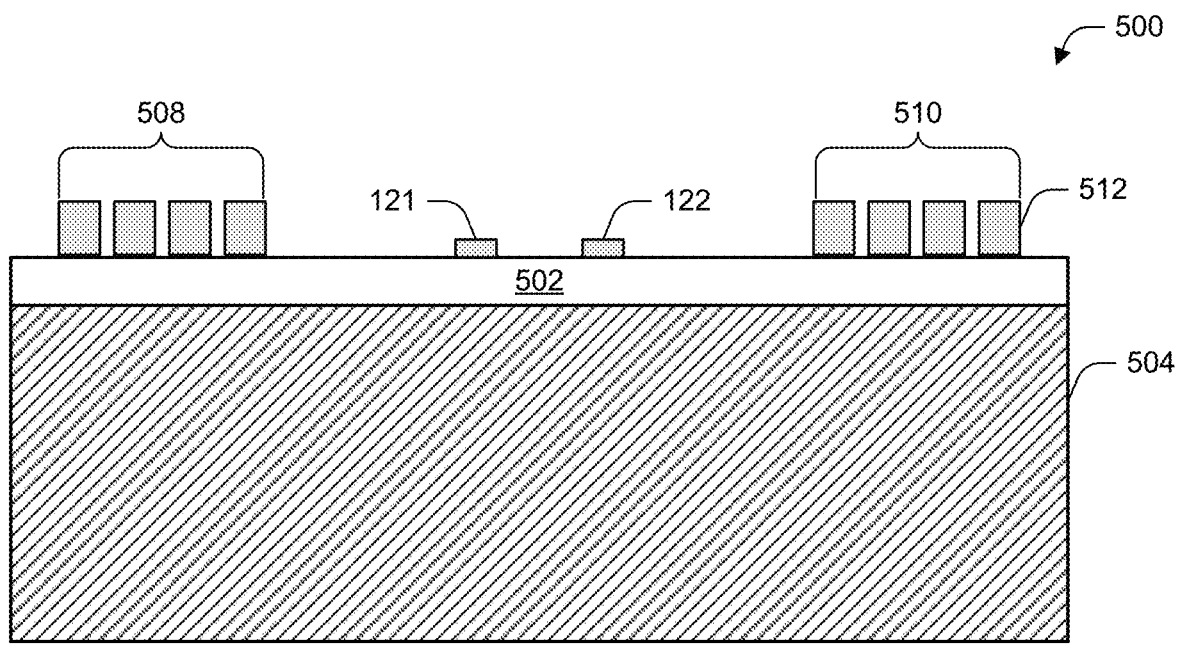

In still further embodiments, a resonating portion can be deposited on a substrate, and additional acoustic isolation features provided. By way of example and referring now to FIGS. 11A and 11B, another exemplary microresonator 500 is shown, wherein a layer of piezoelectric material 502 (e.g., lithium niobate or lithium tantalate) is deposited on a substrate 504 (e.g., silicon). FIG. 11A is a top view of the microresonator 500, while FIG. 11B is a cross-sectional view of the microresonator 500 taken along line 3-3. The microresonator 500 further comprises the electrodes 121, 122, wires 131, 132, and pads 141, 142, each of which is deposited on or otherwise affixed to a top surface of the layer of piezoelectric material 502. A region in which the electrodes 121, 122 extend parallel to one another defines a resonating portion 506 of the microresonator 500. The microresonator 500 further includes Bragg mirrors 508, 510, which provide acoustic isolation, thereby constraining an acoustic wave to propagate within the resonating portion 506. The Bragg mirrors 508, 510 are positioned on opposite sides of the resonating portion 506 and extend along the length of the resonating portion 506. In a non-limiting example, the Bragg mirrors 508, 510 can extend along substantially the entire length of the microresonator 500. In exemplary embodiments, the Bragg mirrors 508, 510 each comprise a plurality of dielectric elements (e.g., dielectric element 512). The microresonator 500 can be simpler to fabricate than other resonating devices, since the microresonator 500 does not require complex patterning of the piezoelectric material 502. This can simplify fabrication when the piezoelectric material 502 comprises a material, such as lithium niobate, that is difficult to pattern using monolithic and semiconductor fabrication techniques (e.g., photolithography, etching, and the like).

Additional microresonators (e.g., length-extensional resonators, contour mode resonators, thickness mode resonators, ring resonators, and bar resonators), piezoelectric materials, and anchoring region designs are described in U.S. Pat. Nos. 7,652,547, 8,367,305, 8,669,823, and 9,641,154; Wang R et al., "Thin-film lithium niobate contour-mode resonators," *Proc.* 2012 *IEEE Int'l Ultrason. Symp.* (*IUS*), held on 7-10 Oct. 2012, in Dresden, Germany, pp. 303-6; Kadota M et al., "High-frequency Lamb wave device composed of MEMS structure using LiNbO$_3$ thin film and air gap," *IEEE Trans. Ultrason. Ferroelectr. Freq. Control* 2010 November; 57(11):2564-71; Olsson III R H et al., "A high electromechanical coupling efficient SH0 Lamb wave lithium niobite micromechanical resonator and a method for fabrication," *Sens. Actuat.* A 2014; 209:183-90; Branch D W et al., "Investigation of a solid-state tuning behavior in lithium niobate," *IEEE MTT-S International Microwave Workshop Series on Advanced Materials and Processes for RF and THz Applications*, held on 16-18 Jul. 2018 in Ann Arbor, Mich. (3 pp.); Burkov S I et al., "Calculation of thermostable directions and the influence of bias electric field on the propagation of the Lamb and SH waves in langasite single crystal plates," *IEEE International Ultrasonics Symposium*, held on 11-14 Oct. 2010 in San Diego, Calif., pp. 1853-1856; Gong S et al., "Large frequency tuning of lithium niobate laterally vibrating MEMS resonators via electric boundary reconfiguration," *Transducers & Eurosensors XXVII: The 17th International Conference on Solid-State Sensors, Actuators and Microsystems*, held on 16-20 Jun. 2013 in Barcelona, Spain (4 pp.); Kourani A et al., "A 150 MHz voltage controlled oscillator using lithium niobate RF-MEMS resonator," *IEEE MTT-S International Microwave Symposium*, held on 4-9 Jun. 2017 in Honolulu, Hi. (4 pp.); Pijolat M et al., "Bias controlled electrostrictive longitudinal resonance in X-cut lithium niobate thin films resonator," *Appl. Phys. Lett.* 2011; 98:232902 (3 pp.); Yen S et al., "A tunable notch filter using high-k$_t^2$ lithium niobate resonators toward integration in filter banks," *IEEE MTT-S International Microwave Symposium*, held on 17-22 May 2015 in Phoenix, Ariz. (4 pp.), each of which is incorporated herein by reference in its entirety.

Piezoelectric Material, Including a Single Crystal Form Thereof

The present invention includes microresonators and methods that employ a piezoelectric material (e.g., a piezoelectric crystal). In particular embodiments, the crystal is of crystallographic class 3m, such as lithium niobate or lithium tantalate. In other embodiments, the piezoelectric material includes langasite, lead titanate zirconate, aluminum nitride, bismuth germanium oxide, and others. Piezoelectric materials can include layers of any of these, as well as one or more piezoelectric materials disposed on a substrate (e.g., silica, fused silica, quartz, fused quartz, etc.). Furthermore, such materials can be provided within a stack, e.g., a stack having a thin film of a piezoelectric material, a top electrode layer (e.g., including a metal, such as any described herein) disposed on a top surface of the thin film, a bottom electrode layer disposed on a bottom surface of the thin film, a bonding layer (e.g., including silicon oxide) disposed on a bottom surface of the bottom electrode layer, and a handling substrate (e.g., silicon or a piezoelectric material) disposed on a bottom surface of the bonding layer.

Single crystals are available as plate cuts along a particular crystallographic axis or axes. Fundamental acoustic waves propagate differently through different plate cuts. For instance, in an X-cut lithium niobate plate, shear $SH_0$ waves with a propagation direction that is 170° from the y-axis have a coupling coefficient $K^2$ of about 38. In contrast, for that same X-cut plate and propagation direction, asymmetric $A_0$ waves have a coupling coefficient $K^2$ of about 0.8. In another instance, in a Y-cut lithium niobate plate, $SH_0$ waves with a propagation direction that is 0° from the x-axis have a coupling coefficient $K^2$ of about 35. In contrast, for that same Y-cut plate and propagation direction, $A_0$ waves have a coupling coefficient $K^2$ of about 4. Accordingly, the particular cut of a single crystal, as well as the propagation direction (e.g., as controlled by the geometry and arrangement of the driving electrodes), provide microresonators having different modes and coupling coefficients.

Figure 3:
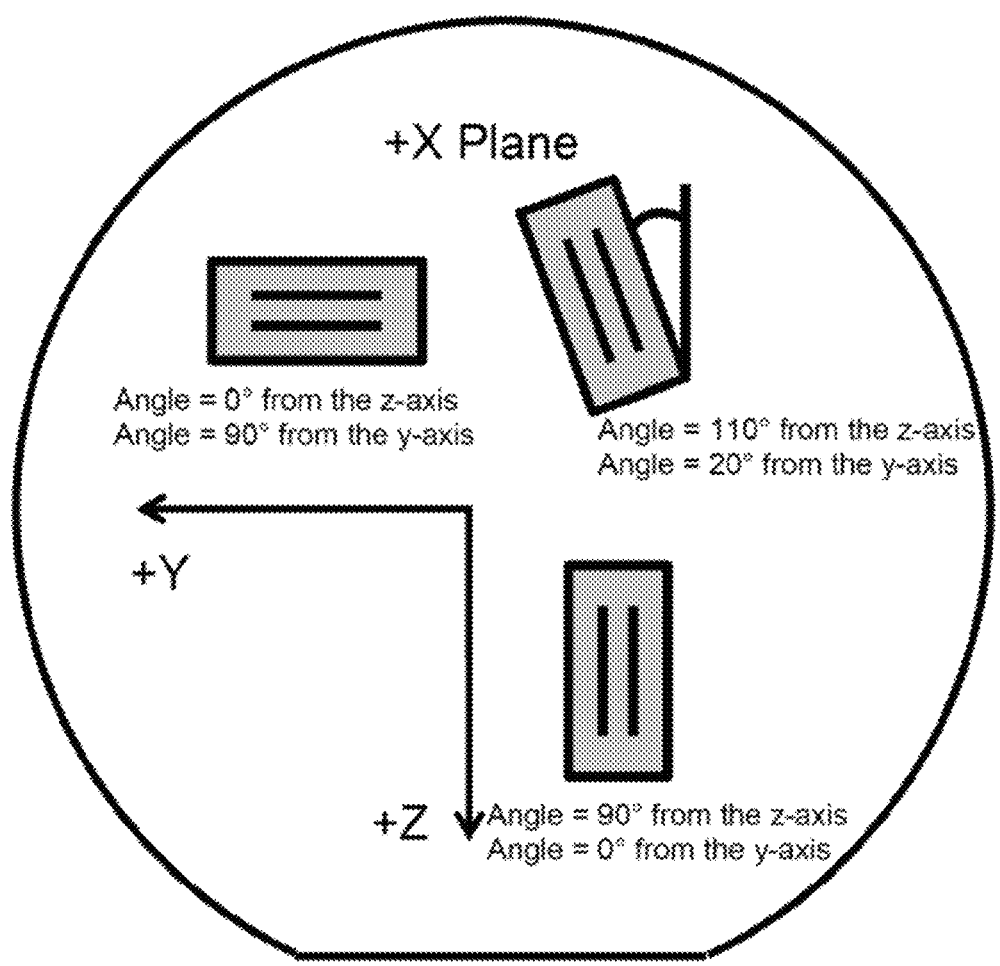
FIG. 3 is a top down schematic of an X-cut $LiNbO_3$ wafer showing the Z-axis and Y-axis of the crystal planes. Gray rectangles represent the microresonator having two electrodes (parallel black lines). Shown are angles of acoustic propagation relative to the Z-axis or Y-axis. The coupling coefficient and sound velocity for each Lamb mode vary with the direction of acoustic propagation.

Exemplary cuts include X-cut, Y-cut, and Z-cut plates, as well as rotated cuts. Within these cuts, the acoustic wave propagates at a particular angle from an axis. For example, FIG. 3 provides a schematic of an X-cut single crystal having wave propagation directions relative to the z-axis or the y-axis. Based on the location and arrangement of the electrodes, the propagation direction of the acoustic wave can be controlled.

Methods of Fabrication

The resonators herein can be fabricated in any useful manner. In some embodiments, the methods include use of a single crystal in crystallographic class 3m (e.g., lithium niobate or lithium tantalate). The exemplary method can include forming a damaged layer beneath the top surface of the crystal, providing at least one trench to access that damaged layer, and then removing the damaged layer with an etchant. In this manner, the resonating portion, the support structure, and the anchoring regions configured to suspend the resonating portion are formed within the same single crystal. In particular, the methods do not require costly wafer bonding, polishing, or fracturing processes.

The present invention includes methods for fabricating a single crystal microresonator. In particular, the method relies on ion implantation to fracture a sub-surface portion of the single crystal and on subsequent use of an etchant to remove that sub-surface portion. In this way, one dimension of the isolated resonating portion (i.e., thickness h) can be determined lithographically. This method allows other dimensions of the resonating portion (e.g., W and L dimensions) and electrodes (e.g., a, g, and e dimensions) to be determined lithographically. As described herein, these dimensions contribute to various physical characteristics of the microresonator, such as $f_s$, $K^2$, or Q. The ability to control these physical characteristics using lithography provides numerous benefits, such as the ability to form multiple frequency filters on a single die.

In one embodiment, the method for fabricating a micromechanical resonator includes: (i) providing a single 3m crystal (e.g., lithium niobate or lithium tantalate); (ii) treating an exposed area of the single crystal with ions, thereby creating an ion damaged region below the top surface of the crystal; (iii) providing at least one trench that defines a first dimension of the resonator; and (iv) removing the ion damaged layer with an etchant. In some embodiments, the method thereby releases at least a resonating portion of the resonator from the crystal.

In some embodiments, the method includes, before step (ii), patterning a top surface of the crystal with a mask, thereby defining the exposed area. In other embodiments, the mask includes a plurality of exposed areas. In further embodiments, each exposed area defines a resonating portion of a resonator, thereby providing a plurality of micromechanical resonators on a single die. In yet other embodiments, two or more of the plurality of micromechanical resonators are the same or different.

In some embodiments, the method includes, before step (iv), depositing a protective layer on the first dimension of the resonator. In further embodiments, the method includes stripping the protective layer (e.g., after step (iv)). In other embodiments, the method includes, after step (i), depositing a metal layer on a surface of the crystal, where the mask is then patterned on top of the metal layer. In further embodiments, the method includes patterning the metal layer with one or more electrodes (e.g., one or more first electrodes and/or one or more second electrodes, as described herein). In some embodiments, the method includes, after step (iv), annealing the resonator (e.g., thereby healing the ion damaged layer).

Figure 9A:
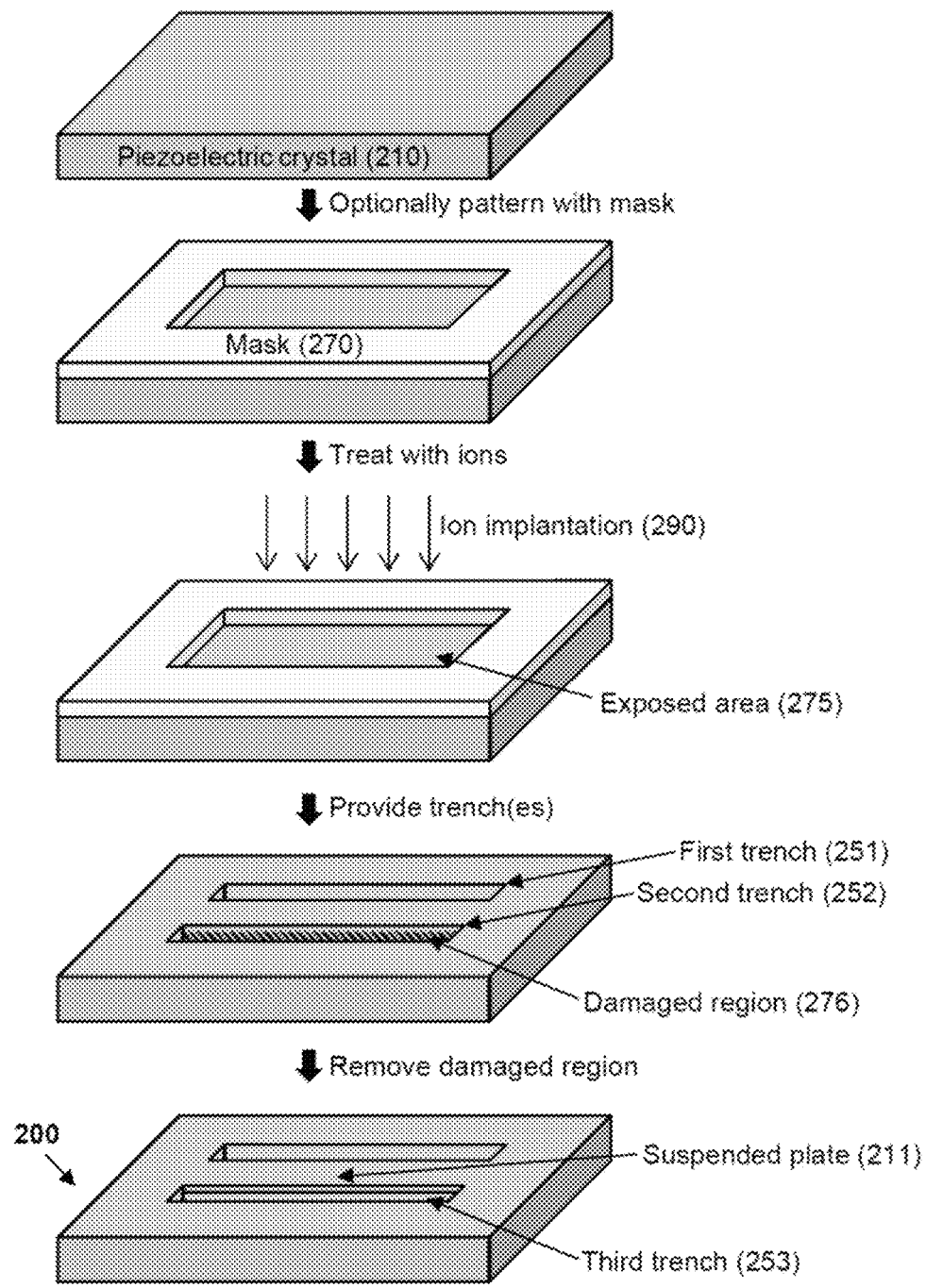
FIGS. 9A-9B show exemplary process flows used to fabricate a microresonator. Provided are (A) a schematic of an exemplary process for fabricating a microresonator 200; and (B) a schematic of an exemplary process for fabricating a microresonator 300 having electrodes.

FIG. 9A describes an exemplary method for forming a thin plate Lamb wave microresonator. The top surface of a substrate 210 (e.g., a single piezoelectric crystal, such as any herein) can include any useful exposed area 275. Optionally, a mask 270 can be patterned on the top surface to define the exposed area 275. The sub-surface portion of the substrate beneath the exposed area will be damaged by ion implantation and ultimately removed. Masked regions will not be exposed to the ions and, therefore, preserved. The mask can be formed from any useful material that will not be penetrated by the ions in the ion implanting step described below. Exemplary mask materials include, e.g., an oxide layer (e.g., $SiO_2$), a hard chrome mask, a nickel mask, a gold mask, etc.

Then, the substrate is exposed to an ion source 290 to provide an ion damaged region 276 below the top surface of the crystal. The ion source can be of any useful type (e.g., helium (e.g., $He^+$), hydrogen, krypton, xenon, magnesium, fluorine, oxygen (e.g., $O^{3+}$), copper, or gold), energy (e.g., of from about 0.5 MeV to about 100 MeV), and fluence (e.g., of from about $10^{12}$ to about $10^{18}$ ions/cm$^2$ or ions/cm$^3$) provided in one or more steps to obtain the appropriate penetration depth, which determines the thickness h of the resonating portion. In some embodiments, the conditions provide a resonating portion having h of from about 0.2 μm to about 2 μm (e.g., about 0.5 μm, 1.0 μm, or 1.5 μm).

Next, one or more trenches 251, 252 are provided to define one or more dimensions of the resonator. For the microresonator 200 in FIG. 9A, the distance between the two trenches determines the width W of the resonating portion, and the length of the trench determines the length L of the resonating portion. The trenches can be provided using any useful technique, such as by patterning the top surface of the substrate with a mask (e.g., an oxide hard mask) defining the trench(es), etching (e.g., dry etching with any useful ion, such as chlorine) the substrate, and then removing the mask. The distance, geometry, arrangement, number, and dimensions of the trenches can be modified to obtain the desired dimensions for the resonating portion of the microresonator(s). In addition, etching conditions can be optimized to ensure that the trenches provide access to the ion damaged region below the surface of the crystal and/or to provide vertical sidewalls for the resonating portion.

Finally, the ion damaged region 276 is removed using an etchant (e.g., a wet etchant), providing a third trench 253 disposed beneath the resonating portion and thereby releasing the resonating portion (here, a suspended plate 211) from the support structure. Any useful etchant can be employed to remove the damaged region. Exemplary etchants include a wet chemical etchant, such as HF and mixtures thereof (e.g., $HNO_3$ and HF mixtures, optionally including ethanol).

Figure 9B:
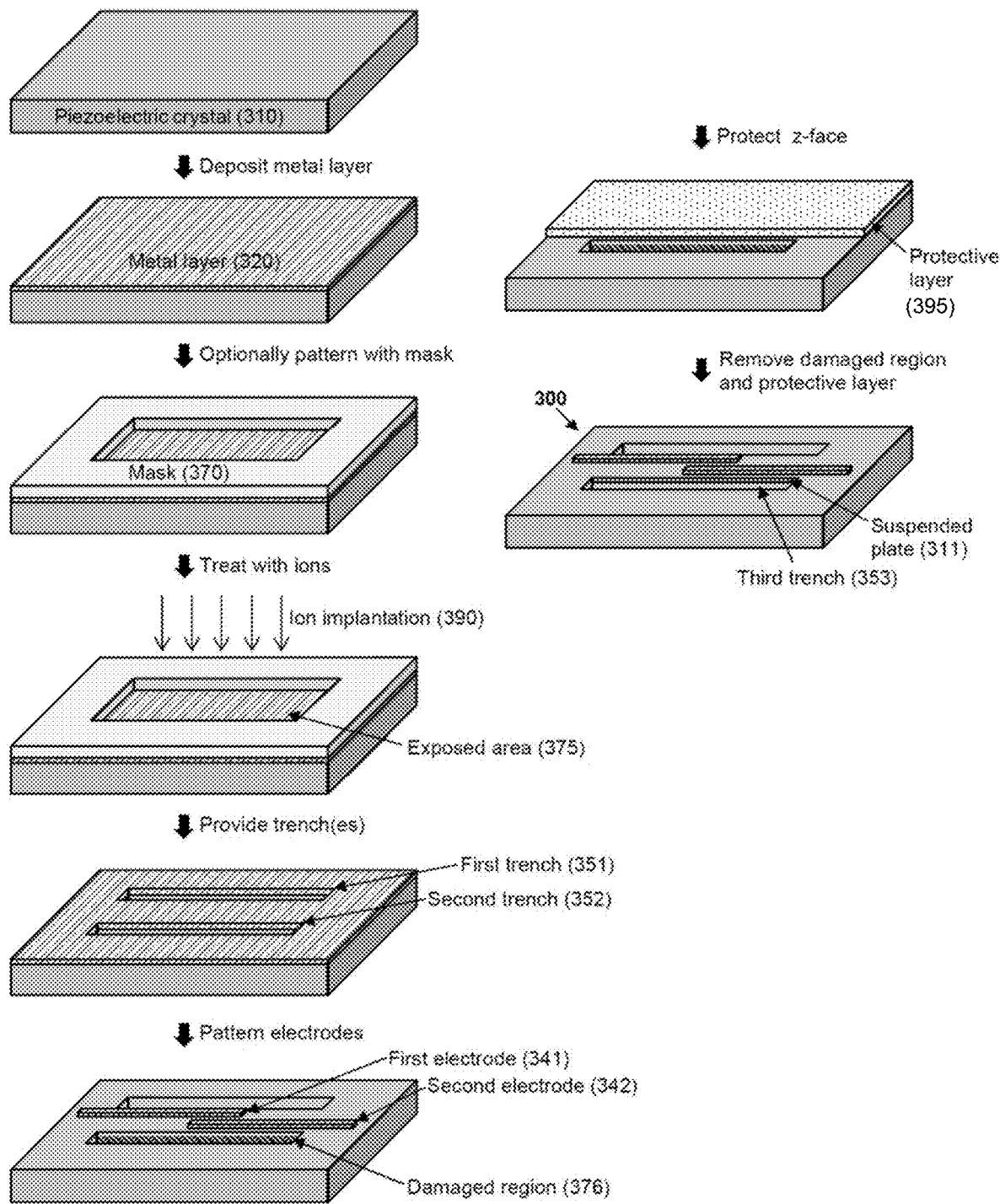

The method can include any number of other useful steps. FIG. 9B provides an exemplary method of fabricating a microresonator having a pair of electrodes, as described below. First, a metal layer 320 is deposited on a substrate 310 (e.g., a single crystal) by any useful manner (e.g., evaporation, deposition, etc.). Optionally, one or more alignment marks are included in the metal layer 320. This metal layer 320 can include one or more metals, metal alloys, or metal layers useful for making an electrode (e.g., any metal described herein).

Next, the top surface of the substrate 310 having the metal layer 320 is optionally patterned with a mask 370 to define the exposed area 375. The substrate is exposed to an ion source 390 to provide an ion damaged region 376 below the top surface of the crystal. Next, one or more trenches 351, 352 are provided to define one or more dimensions of the resonator.

Then, the metal layer is patterned to provide one or more electrodes. For instance, electrodes 341, 342 can then be patterned on the previously deposited metal layer 320. This step can include any useful lithographic and microfabrication technique, such as any described herein. In addition, the electrode pattern can include one or more useful dimensions, such as aperture a, gap g, space s, electrode width e, or any other dimension described herein. The electrode pattern can include an array of n electrodes or n pairs of electrodes (e.g., as described herein).

Optionally, a protective layer 395 can be deposited to protect a surface of the resonator prior to exposure to an etchant (e.g., a wet etchant). As described herein, particular crystallographic faces can have different etch rates. In particular, the –z face of lithium niobate crystal etches at a higher rate using an HF etchant, as compared to the other faces. Thus, when the –z face is exposed, then a protective layer (e.g., a gold layer) can be deposited to protect this face.

Finally, the ion damaged region 376 is removed using an etchant (e.g., HF or any etchant herein), providing a third trench 353 disposed beneath that resonating portion and thereby releasing the resonating portion from the support structure to form the suspended plate 311. If the protective layer is used, then the subsequent step can include a stripping step to strip the protective layer.

Additional steps can include annealing (e.g., about <350° C.), polishing, and/or ovenizing (e.g., use of local joule heaters) to resonators, such any described in Kim B et al., "Ovenized and thermally tunable aluminum nitride microresonators," *Proc. 2010 IEEE Ultrason. Symp. (IUS)*, held on 11-14 Oct. 2010 in San Diego, Calif., pp. 974-8; and U.S. Pat. No. 8,669,823, each of which is incorporated herein by reference in its entirety.

Uses

The microresonators and methods of the present invention can be applied for any beneficial use. Exemplary uses include one or more resonators to form a band select filter (e.g., for use in wireless handsets), a filter bank, an oscillator, a sensor, and arrays thereof. For use in an array (e.g., including a plurality of resonators in parallel), each resonator can be electrically interconnected (e.g., by way of wires, bias lines, etc.) to provide a composite resonator. The array can also include a substrate and a plurality of networks formed on the substrate, where each network is electrically connected in parallel. The array can include at least one input configured to receive an electrical signal and relay this signal to the lattice networks, as well as at least one output to provide a filtered electrical signal. Each network can include at least one microresonator (e.g., any microresonator described herein, where each microresonator can optionally have a different resonant frequency or physical dimension). Additional arrays and uses are described in U.S. Pat. Nos. 7,385,334 and 8,497,747; Aigner R, "MEMS in RF filter applications: thin-film bulk acoustic wave technology," *Sensors Update* 2003 February; 12(1):175-210; Malocha D C, "SAW/BAW acoustoelectronic technology for filters and communication systems," *Proc. 2010 IEEE 11th Annu. Wireless & Microwave Technol. Conf. (WAMICON)*, held on 12-13 Apr. 2010 in Melbourne, Fla., pp. 1-7; and Yantchev V et al., "Thin film Lamb wave resonators in frequency control and sensing applications: a review," *J. Micromech. Microeng.* 2013; 23:043001 (14 pp.), each of which is incorporated herein by reference in its entirety.

EXAMPLES

Example 1: Investigation of a Solid-State Tuning Behavior in Lithium Niobate

Embodiments described herein provide an enabling technology for building complex tunable filters. Tunable acoustic resonators were fabricated in thin plates ($h/\lambda \sim 0.05$) of X-cut lithium niobate (90°, 90°, $\psi=170°$). Lithium niobate has large electromechanical coupling for the shear and symmetric Lamb modes ($SH_0$: $K^2=40\%$, $S_0$: $K^2=30\%$) and thus is applicable for low-insertion loss and wideband filter applications. The effect of a dc bias to shift the resonant frequency by ~0.4% can be demonstrated by directly tuning the resonator material. A nonlinear acoustic simulation predicted 0.36% tuning, which is in agreement with the tuning measurement. Moreover, electrical tuning of the $S_0$ mode is predicted to be up to 1.6% using the nonlinear theory. The mechanism is based on the nonlinearities that exist in the piezoelectric properties of lithium niobate. The $SH_0$ mode devices were centered at ~335 MHz and achieved frequency tuning of 6 kHz/V through application of a dc bias.

RF filters with adaptive properties such as tunable center frequency and variable bandwidth can enable future multi-function, cognitive, and adaptive RF communication systems. However, it has been particularly challenging to develop tunable RF building blocks for mobile applications because of the required performance metrics. At present, tuning techniques are primarily based on changing load impedances with MEMs or using solid-state devices in discrete circuits, many achieving excellent performance. Specifically, tunable RF and microwave filters consist of using ferroelectric thin film varactors, evanescent-mode waveguide filters, MEMS switches, planar tunable filters, ferrimagnetic yttrium-iron-garnet (YIG) resonators, and reconfigurable contour-mode resonators. YIG tunable filters offer multi-octave tuning using external magnetic fields with an unloaded Q around 2000 to 5000, however, they require large power consumption (e.g., from about 0.75 W to 3 W). Thus, they are not suitable for mobile applications. In contrast, electromagnetic RF filters that are tuned with solid-state technologies such as ferroelectric, semiconductor, or MEMS devices to realize voltage tunable capacitors are well-suited for compact tunable RF filters in low power applications. However, the performance and application of these filters is limited by their large size and low Q (e.g., less than about 400 at 1 to 10 GHz) relative to piezoelectric filters. Because of these challenges, high-Q tunable piezoelectric filters remain elusive.

A recent finding demonstrates that the application of a dc voltage bias in piezoelectric layers induces two key effects: (i) induced longitudinal coupling, where only shear modes were normally present, and (ii) a dependence of the phase velocity on the applied dc electric field via electrostriction and nonlinear effects in a theoretical study in langasite. In other ferroelectric materials such as lead titanate zirconate (PZT), the application of a dc bias has been shown to overcome residual stresses, which enhanced the electromechanical properties of a thin film device. In studies on the material stoichiometry and phase transitions, the elastic modulus, mechanical loss, and dielectric properties appear to be connected. If the material properties can be substantially affected, combined with geometrical changes, or phase transition dependencies by various loading or bias conditions, it may lead to an effective method for tuning RF devices.

LiNbO$_3$ has a resonator Q of about 10,000 at 1 GHz with highly reproducible material properties, making it an excellent choice for RF acoustic resonators and filter applications. Using thin plates of X-cut LiNbO$_3$ has enabled low insertion loss, wideband filters for RF and microwave devices. These acoustic resonators utilize the lowest order shear mode (SH$_0$) or Lamb mode (S$_0$) in thin plates of LiNbO$_3$, where the propagation is rotated 170° or 34° from the +Y-axis, respectively.

As described herein, it has been demonstrated that a dc-bias can tune the resonant frequency of microresonators fabricated on LiNbO$_3$. In some instances, the tuning effect was ~1%, however, other crystal cuts and orientations may yield larger tuning behavior, which can be discovered by invoking the third-order material constants. Herein, also described is a nonlinear simulation method to search for larger tuning behavior in LiNbO$_3$ and other piezoelectric materials. It then compares the simulation with the experimental results for thin plates of X-cut LiNbO$_3$, while making predictions for other orientations.

Example 2: Theory Regarding Acoustic Velocities in a Piezoelectric Plate

A Green's function analysis was performed to compute the acoustic phase velocities in the absence and presence of an applied dc electric field. The electric field can be set to an arbitrary direction in the simulation; however, it was set as parallel to the acoustic propagation direction since the dc electric field was applied between the interdigital electrodes. For thin layers or multilayered structures operating at gigahertz frequencies, a recently developed approach uses a recursive asymptotic stiffness method (RSM) to compute the generalized Green's function and is numerically stable for thin layers (h/λ<<1). The approach is based on a linear treatment of the piezoelectric equations derived from Newton's and Hooke's laws, and the Maxwell's equations:

$$\sum_{jkl} c_{ijkl}^E \frac{\partial^2 u_k}{\partial x_i \partial x_l} + \sum_{kj} e_{kij} \frac{\partial^2 \phi}{\partial x_k \partial x_i} = \rho \frac{\partial^2 u_j}{\partial t^2} \quad (1)$$

and $$\sum_{ikl} e_{ikl} \frac{\partial^2 u_k}{\partial x_i \partial x_l} - \sum_{ik} \varepsilon_{ik}^S \frac{\partial^2 \phi}{\partial x_i \partial x_k} = 0,$$

where $c_{iklm}^E$, $e_{nik}$, and $\varepsilon_{nm}^\eta$ are the second-order elastic stiffness, piezoelectric, and dielectric tensors, respectively. As shown, eq. (1) ignores explicit terms that depend on the electric field, higher-order material constants, thermal expansion, and pyroelectric coefficients. To incorporate nonlinear effects, the materials constants in eq. (1) will be treated as effective materials constants in the following description. Instead of using the traditional plane wave trial solution, an eight-dimensional state-vector is defined as follows:

$$\xi = [u \phi T D]^T \quad (2)$$

where u are the mechanical displacements u$_1$, u$_2$, and u$_3$, $\phi$ is the electrostatic potential, T are the three-dimensional stress components, and D is the electric displacement. Using the definition of the state-vector of eq. (2) and also eq. (1), a matrix differential equation, which is the essence of the Stroh formalism has been defined as follows:

$$\frac{d\xi}{dz} = jA\xi, \quad (3)$$

where A is the fundamental acoustic tensor. The solution of eq. (3) is the exponential matrix solution B, which relates the state vector at the top layer (z) to the bottom layer (z−h). Using the method described by Rokhlin, the solution B is written as a series expansion for a thin layer, which is obtained by subdividing a thick layer H into the thicknesses h, in which h=H/2$^n$, and taking the product of all the layers. The solution has been shown to converge to the exact solution and is used to define a stiffness matrix K. In terms of the stiffness matrix, the Green's function for a piezoelectric layered system relates the general displacements to the surface mechanical stress as follows:

$$G_L = \begin{bmatrix} K_{11}^f & K_{11}^{fe} & K_{12}^f & K_{12}^{fe} \\ K_{11}^{ef} & k_x \varepsilon_o - K_{11}^e & K_{12}^{ef} & -K_{12}^e \\ K_{21}^f & K_{21}^{fe} & K_{22}^f & K_{22}^{fe} \\ K_{21}^{ef} & K_{21}^e & K_{22}^{ef} & K_{22}^e + k_x \varepsilon_o \end{bmatrix}, \quad (4)$$

where K (8×8) is the global stiffness matrix for the layered system computed using RSM. K is derived from the fundamental acoustic tensor or Stroh matrix for a piezoelectric layer and is dependent on the material constants, frequency, velocity, and thickness of the layers. The superscripts denote the mechanical (K$_{i,j}^f$) (3×3), mechanical-electrical (K$_{i,j}^{ef}$) (3×1), electrical-mechanical (K$_{i,j}^{fe}$) (1×3), and electrical coupling (k$_x$ε$_o$−K$_{11}^e$) (1×1) terms. For a stress-free plate on the top and bottom surfaces with an open-circuit at the bottom interface (i.e., charge density=0), the effective permittivity can be computed as follows:

$$\varepsilon_{eff}(k_x, \omega) = \varepsilon_o - \frac{1}{|k_x| \left( S_{11}^e - S_{12}^e \left( \frac{1}{k_x \varepsilon_o} + S_{12}^e \right)^{-1} S_{21}^e \right)}, \quad (5)$$

where $S_{ij}^e(k_x,\omega)$ are the compliances, $k_x$ is the wavenumber, and $\varepsilon_0$ is the permittivity of free space. The explicit frequency and wavenumber dependence of $S_{ij}^e$ is omitted. The effective permittivity for a short-circuit at the bottom interface is as follows:

$$\varepsilon_{\mathit{eff}}(k_x,\omega) = \varepsilon_o - \frac{1}{|k_x|\left(S_{11}^e - S_{12}^e(S_{22}^e)^{-1}S_{21}^e\right)}. \tag{6}$$

In the simulations, the piezoelectric plate was divided into $N=8$ sublayers or $2^8$ recursions. The total stiffness matrix K was obtained by recursively combining all the individual stiffness matrices from the layer using the recursive algorithm.

Example 3: Simulation of the $SH_0$ Mode

In thin plates of lithium niobate ($LiNbO_3$), two modes with very large electromechanical coupling exists, namely Lamb (X-cut, $S_0$, $K^2=30\%$) and shear (X-cut, shear, $K^2=36\%$; Y-cut, shear, $K^2=38\%$).[20] The electromechanical coupling $K^2$ is the electrical-to-mechanical conversion efficiency, which is a significant parameter for piezoelectric materials because it determines the bandwidth and insertion loss of a filter. It can be estimated by computing the acoustic velocities for the open and short-circuit electrical (i.e., $K^2 \approx 2(v_o - v_m)/v_o$) boundary conditions or more specifically from the residue of the Green's function evaluated at the pole. The former method has been shown to be accurate for anti-symmetric and symmetric Lamb modes when $h/\lambda<1$, which is valid for the cases considered herein.

Figure 4A:
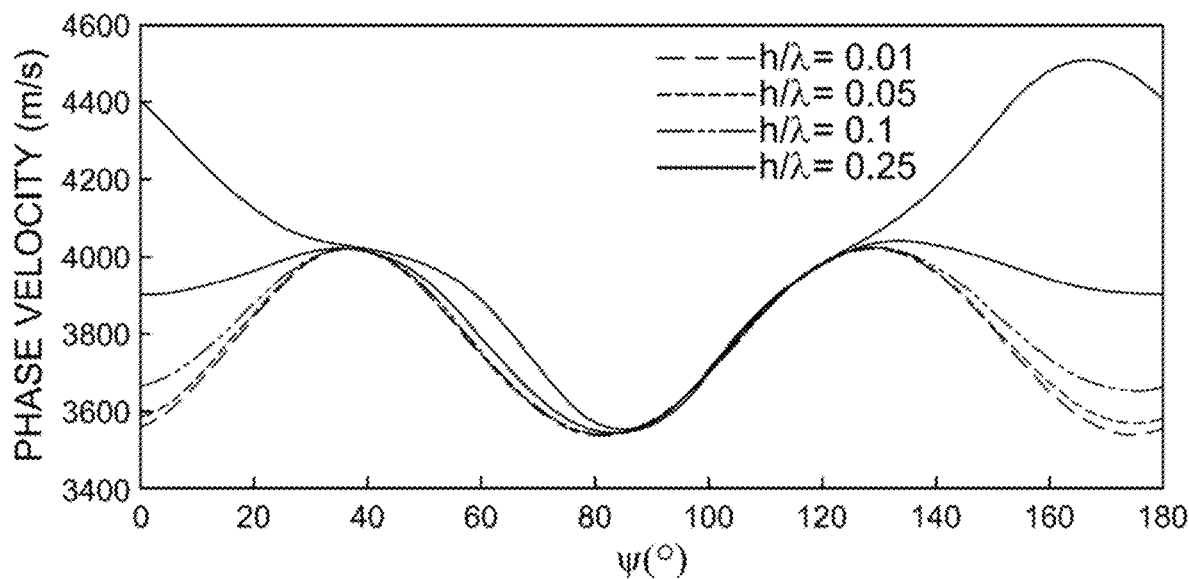
FIGS. 4A-4B show simulated $SH_0$ mode phase velocities for X cut (90°, 90°, ψ) lithium niobate for (A) electrically open and short-circuit (lower four plots), conditions under stress free conditions; and (B) electromechanical coupling $K^2$, showing the large coupling of the $SH_0$ mode at ψ=0° and ψ=170°.
Figure 4B:
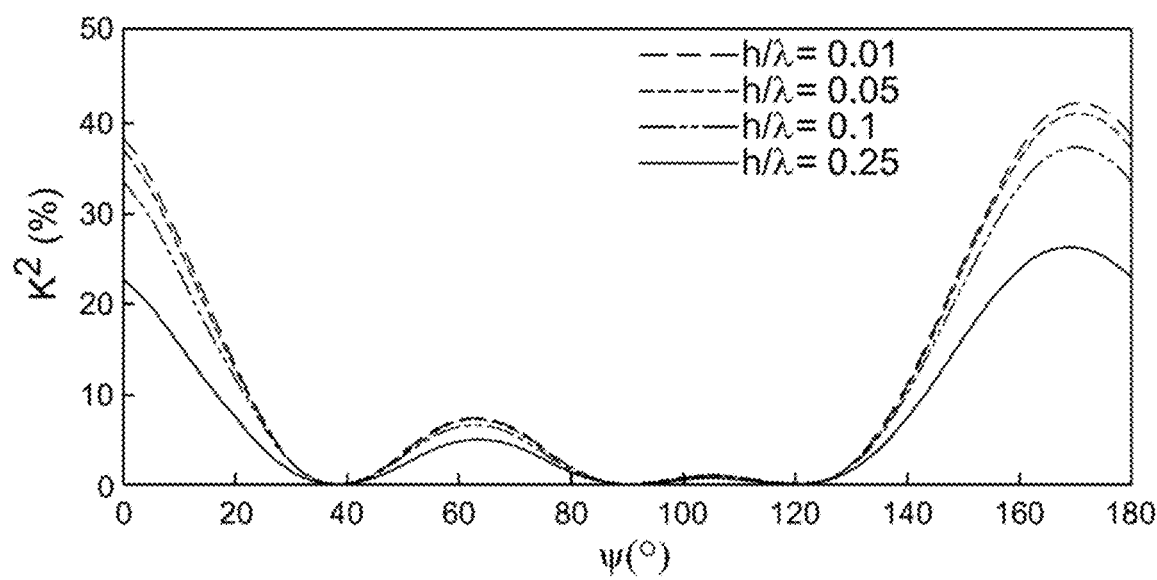

In FIG. 4A, the open and short-circuit phase velocities are shown under stress-free conditions with an open-circuit condition for the bottom interface. The open-circuit velocities do not strongly depend on the plate thickness, whereas the short-circuit condition has a stronger dependence and produces a large $K^2$ at specific angles of $\psi$ (FIG. 4B).

Example 4: Simulation of the $S_0$ Mode

Figure 5A:
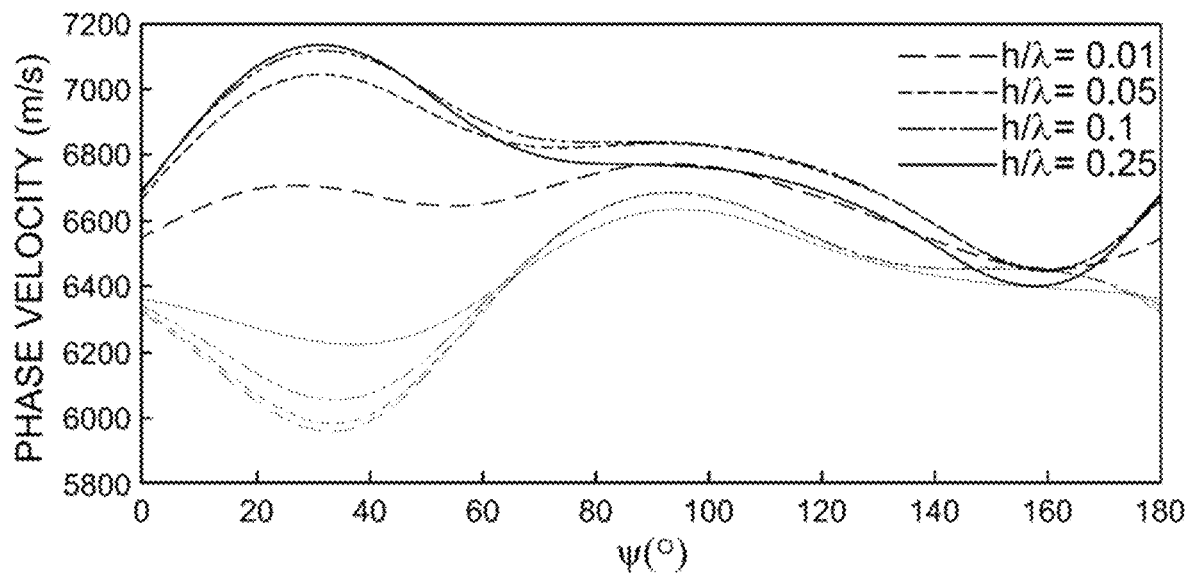
FIGS. 5A-5B show simulated $S_0$ mode phase velocities for X cut (90°, 90°, ψ) lithium niobate for (A) electrically open and short-circuit (lower four plots), conditions under stress free conditions; and (B) electromechanical coupling $K^2$, showing the large coupling of the $S_0$ mode at ψ=34°.
Figure 5B:
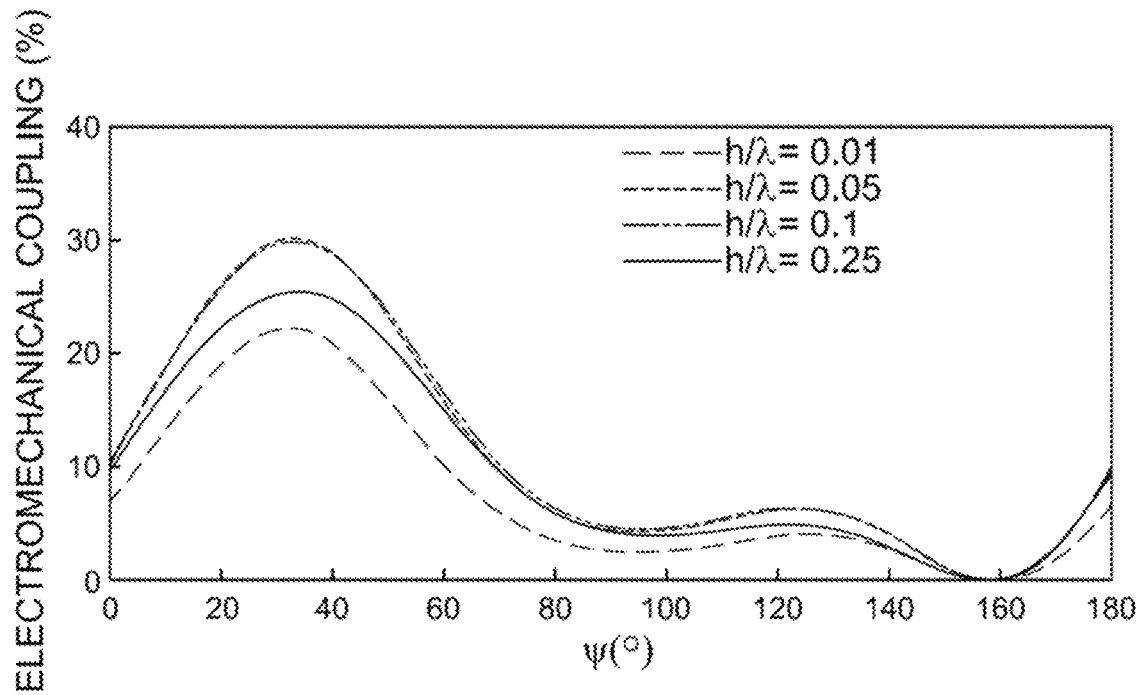

Symmetric Lamb modes ($S_0$) also exist in thin plates of lithium niobate at an acoustic velocity about 1.6 times higher than the $SH_0$ mode. In FIGS. 5A-5B, the open and short-circuit phase velocities are shown under stress-free conditions for a stress-free plate of lithium niobate. In this case, there is a stronger dependence of the open-circuit phase velocity on the plate thickness. When $\psi=34°$, $K^2$ reaches a maximum value of about 30% when the normalized plate thickness ($h/\lambda$) is less than 0.05.

Example 5: Elastic Wave Propagation Under the Influence of Homogeneous Dc Electric Field The theory of nonlinear electrostatic effects was first given by Baumhauer and Tiersten for the approximation of small-amplitude acoustic waves superposed on a bias field. Based on the theory of small biasing strains, the acoustic behavior in the presence of a bias field can be described through effective material constants which are different due to the perturbation terms compared to the unbiased material.

In a piezoelectric plate held under a constant electric field, stresses are induced from application of strains in specific directions through the second and higher order elastic stiffness, piezoelectric, and dielectric tensors. In lithium niobate, the third-order constants play an important role in the nonlinear effects in acoustic wave propagation. These third-order constants arise from a Taylor series expansion of the thermodynamic Gibb's potential in the strain and electric field. Based on thermodynamic differentials, the "effective" elastic stiffness, piezoelectric, permittivity constants have been expressed as linear functions of an externally applied dc electric field as follows:

$$c^*_{iklm} = c_{iklm} + (c_{iklmpq}{}^E d_{jpq} - e_{jiklm})M_j E$$

$$e^*_{nik} = e_{nik} + (e_{nikpq}d_{jpq} + H_{njik})M_j E$$

$$\varepsilon^*_{nm} = \varepsilon_{nm}{}^\eta + (H_{nmik}d_{jik} + \varepsilon_{nmj}{}^\eta)M_j E, \tag{7}$$

where $c_{iklm}{}^E$, $e_{nik}$, and $\varepsilon_{nm}{}^\eta$ are the second-order elastic stiffness, piezoelectric, and dielectric tensors, respectively; $c_{iklmpq}{}^E$ is the third-order elastic stiffness tensor; $d_{jpq}$ is the piezoelectric strain defined as $d_{ijk} = e_{ilm} S_{lmjk}$; $H_{njik}$ is the electrostriction tensor; $e_{jiklm}$ is the third-order piezoelectric tensor; $\varepsilon_{nmj}{}^\eta$ is the third-order dielectric tensor; E is the electric field; and M is the unit vector specifying the direction of E.

In these expressions, the third-order constants follow a linear dependence on the applied electric field. The expressions in eq. (7) were derived under the assumption of uniaxial mechanical stress with homogeneous electric fields and require knowledge of the complete third-order material constants. The second and third-order constants are assumed to be unchanged by the mechanical stress, where the elastic, piezoelectric, and dielectric constants appearing in eq. (1) become the "effective" stiffness, piezoelectric, and dielectric tensors due to an applied electric field.

For $LiNbO_3$ as class 3m, the third-order elastic constants (TOEC) ($C_{(ij)/(kl)(mn)})=C_{IJK}$, electrostriction ($I_{(ij)/(kl)}$), piezoelectric ($e_{i(jk(lm)}$), and dielectric constants ($\varepsilon_{i(jk)}$) have been measured.[27] The TOEC is a 6th rank tensor that contains $3^6 = 729$ elements. However, due to the following symmetry conditions:

$$c_{ijklmn} = c_{jiklmn}$$

$$c_{ijklmn} = c_{klijmn} = c_{mnklij}, \tag{8}$$

there are at most 56 independent third-order elastic constants and 14 non-zero components for lithium niobate. In summary, there are 13 independent piezoelectric, 8 electrostriction, and 3 dielectric third-order constants.

Example 6: Tensor Definitions and Rotations

To apply eq. (7) for different crystal orientations, the constants were rotated using the general relations:

$$\bar{c}^*_{ijkl} = Q_{ia}Q_{jb}Q_{kc}Q_{ld}c^*_{abcd}$$

$$\bar{e}^*_{ijk} = Q_{ia}Q_{jb}Q_{kc}e^*_{abc}$$

$$\bar{\varepsilon}^*_{ij} = Q_{ia}Q_{jb}\varepsilon^*_{ab} \tag{9}$$

where $Q_{ij}$ are the elements of the transformation matrix relating the crystallographic reference frame to the desired rotated coordinate frame and the bar indicates the rotated quantity. To allow for arbitrary electric field orientations the unit vector M is rotated by an arbitrary rotation matrix and then rotated again by the inverse of the coordinate transformation matrix Q before computing the effective constants. All tensor contractions were performed using standard matrix multiplication after matricization (i.e., reshaping) of each pair of tensors being contracted. The calculations were performed numerically and the effective material constants were substituted into eqs. (4), (5), or (6) to compute the effective permittivity with and without a dc bias.

Example 7: Controlling Coefficient of Voltage

Figure 6A:
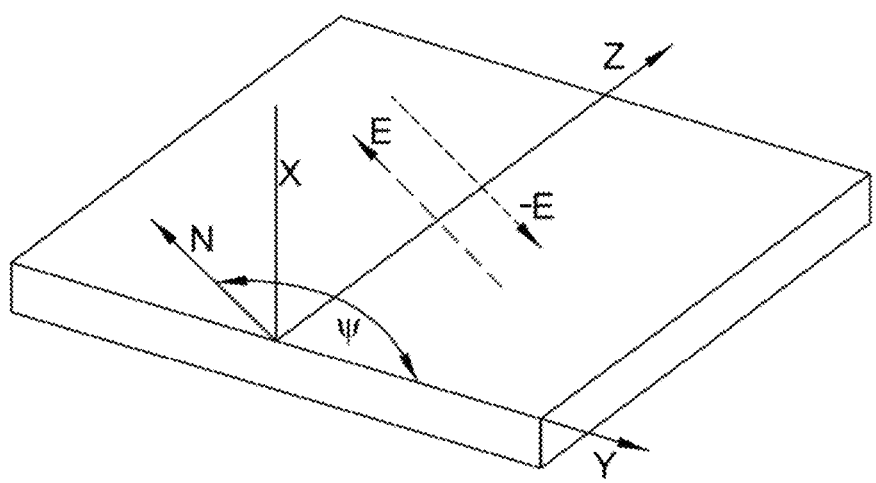
FIGS. 6A-6E show simulated velocity dependence on the dc bias for X-cut (90°, 90°, ψ) in a thin plate of lithium niobate. Provided are (A) a schematic showing the orientation of the lithium niobate plate and dc electric field E (and −E) according to rotation director N and rotation angle ψ from the Y-axis; (B) a graph showing the phase velocity of the $SH_0$ mode; (C) a graph showing the $SH_0$ mode controlling coefficient (for h/λ=0.1); (D) a graph showing the phase velocity of the $S_0$ mode; and (E) a graph showing the $S_0$ mode controlling coefficient (for h/λ=0.06).
Figure 6B:
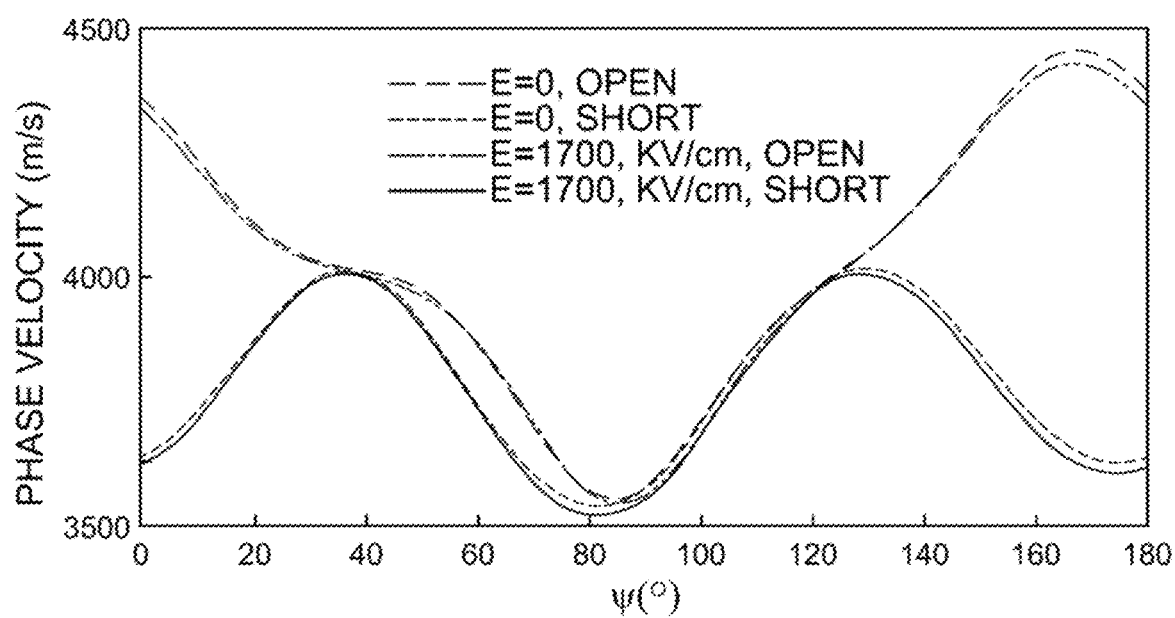
Figure 6C:
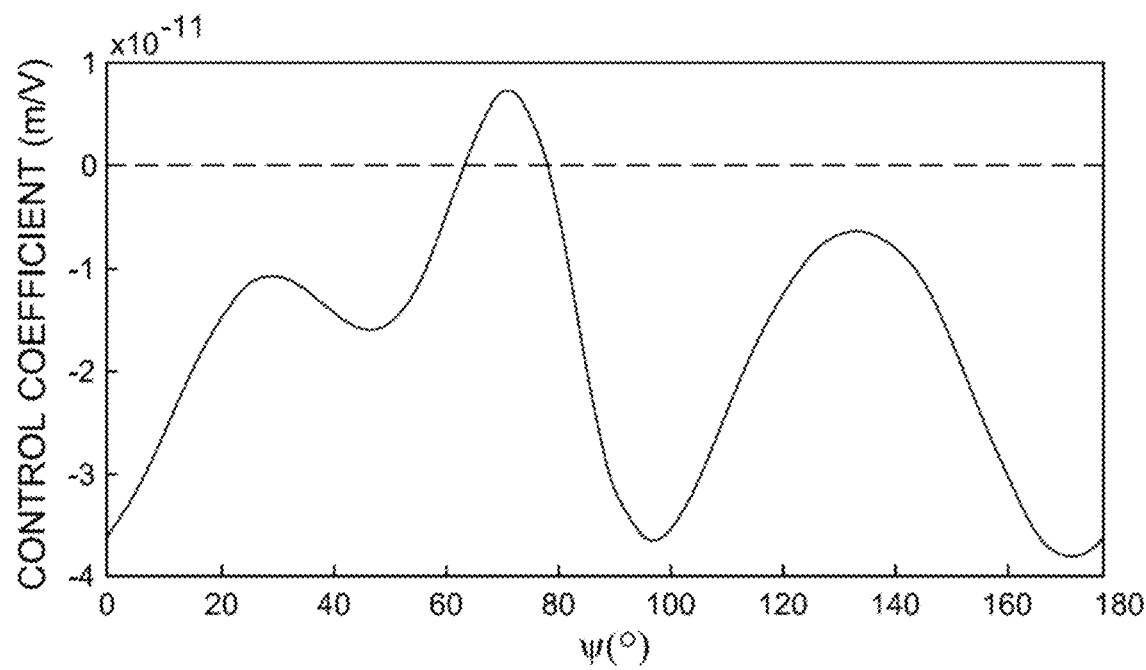
Figure 6D:
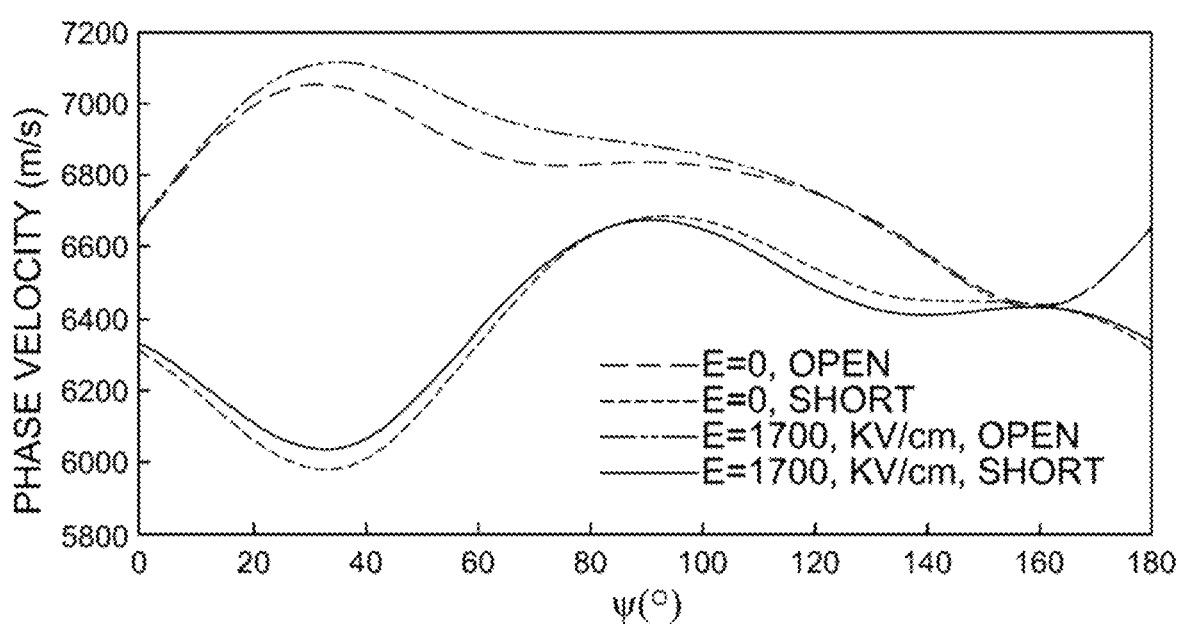

The nonlinear controlling coefficient relates the dependence of the acoustic phase velocity on the applied electric field. It can be defined in terms of mechanical pressure and the dc electric field as follows:

$$\alpha_v = \frac{1}{v_i}\left(\frac{\Delta v}{\Delta E}\right)|_{\Delta E \to 0}, \quad (10)$$

where $v_i$ is the acoustic phase velocity when $E=0$, $\Delta v$ is the change in the acoustic velocity, and $\Delta E$ is the change in the applied dc electric field. The goal is to locate maximum values of $\alpha$, where the electromechanical coupling $K^2$ is sufficient for efficient acoustic wave propagation. In simulations, the electric field was parallel to the acoustic wave propagation direction, which was designated a "positive" bias (FIG. 6A). Anti-parallel was a "negative" bias when the electric field was reversed compared to the acoustic propagation specified by the Euler angles. Acoustic propagation parallel to the Euler angle direction corresponded to a dc electric field between the interdigital fingers. The controlling coefficient was computed (FIG. 6C) for the $SH_0$ mode in X-cut lithium niobate using a plate thickness of 1.2 µm at 335 MHz, giving $h/\lambda=0.1$. The gap between the interdigital fingers was 2 µm. FIG. 6C shows that $\alpha_v$ reaches maximal values at 0° and 174°, with $\alpha=-3.6\cdot10^{-11}$ m/V and $-3.8\cdot10^{-1}$ m/V, respectively. At both angles of $\psi$, $K^2$ is close to a maximum value. At $\psi=170°$, $\Delta v/v=0.6\%$, where $\alpha=-3.7\cdot10^{-11}$ m/V. For the anti-parallel or negative bias, the controlling coefficient was mirrored about the X-axis (not shown) with the same magnitude for the negative bias case. It is not expected that the controlling coefficient $\alpha$ would achieve a maximum at the same cut and rotation where $K^2$ reaches a maximum value, especially for an arbitrary direction of the electric field.

Figure 6E:
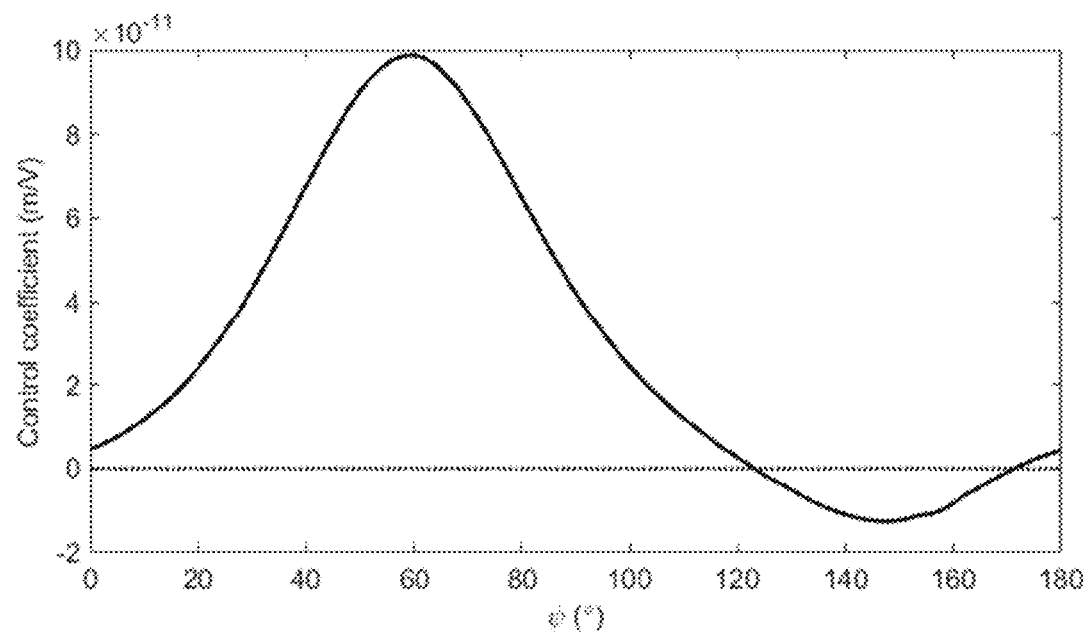

For the $S_0$ mode, the plate thickness was 1.2 µm at 335 MHz, giving $h/\lambda=0.06$ due to the higher acoustic velocity of the $S_0$ mode. The gap between the interdigital fingers was 2 µm. FIG. 6E predicts $\alpha$ reaches maximal values at 60°, with $\alpha=1\cdot10^{-10}$ m/V. At $\psi=60°$, $\Delta v/v=1.6\%$. Similarly, the controlling coefficient was mirrored about the X-axis for the negative bias case (not shown). The theoretical development provides a method of where to look for large values of the nonlinear controlling coefficient, however, higher order effects such as quadratic dependencies in the electric field (i.e., electrostriction) may not be accurately treated. In addition, different authors report a wide range of values for the nonlinear third-order coefficients for lithium niobate, highlighting the importance of experimental verification.

Example 8: Measurements of SH0 Mode LiNbO$_3$ Resonator

Figure 7A:
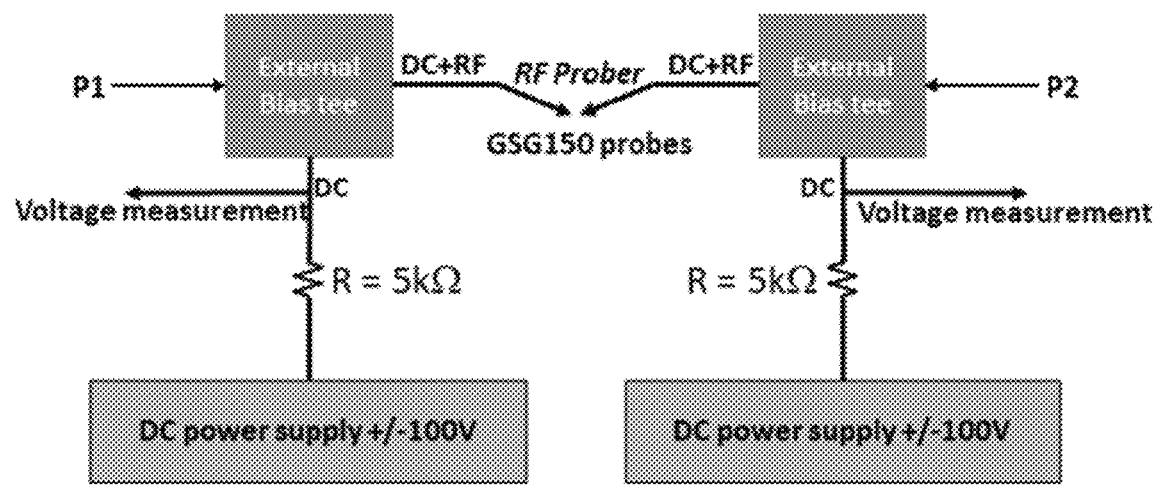
FIGS. 7A-7B show an exemplary experimental setup and the device measurement showing the orientation for the $SH_0$ mode. Provided are (A) a schematic of bias-tees that were used to isolate the RF from the applied dc potential along with current limiting resistors; and (B) a schematic of a single resonator including a pair of interdigital fingers, in which λ=8.8 µm and the bias field was oriented −10° from the +Y-axis.
Figure 7B:
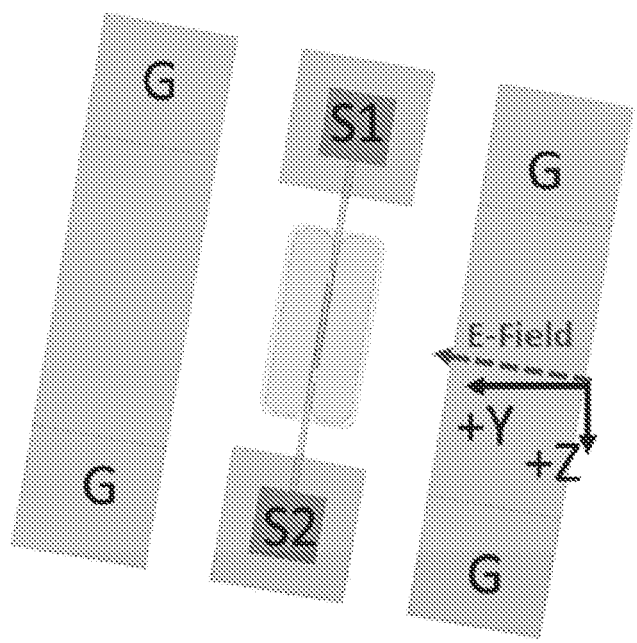

LiNbO$_3$ resonators were fabricated with two interdigital fingers for acoustic propagation of $SH_0$ modes along the (90°, 90°, $\psi=170°$) direction (FIG. 7A). The on-wafer RF measurements were performed using a N5230A network analyzer (Keysight Technologies) calibrated at the GSG150 probe tips. Two bias tees were used to decouple the RF measurement from the dc bias voltage along with two resistors to limit the current. The $SH_0$ mode resonators had a wavelength of 8.8 µm, a finger width of 1 µm, a finger gap of 2 µm, an aperture of 64 µm, and a 0.2 µm gap between the finger and the edge of released substrate. The thickness of the Cr/Au electrodes was 10 nm/100 nm. The plate thickness was 1.2 µm, giving a thickness to wavelength ratio (h/λ) of 0.1. In the absence of a dc bias, the resonant frequency was 334.7 MHz, which corresponded to a phase velocity of 2954 m/s. The phase velocity was lower than the theoretical short circuit conditions due to mass loading from the Au electrodes and variations in the fabricated material parameters.

Figure 8A:
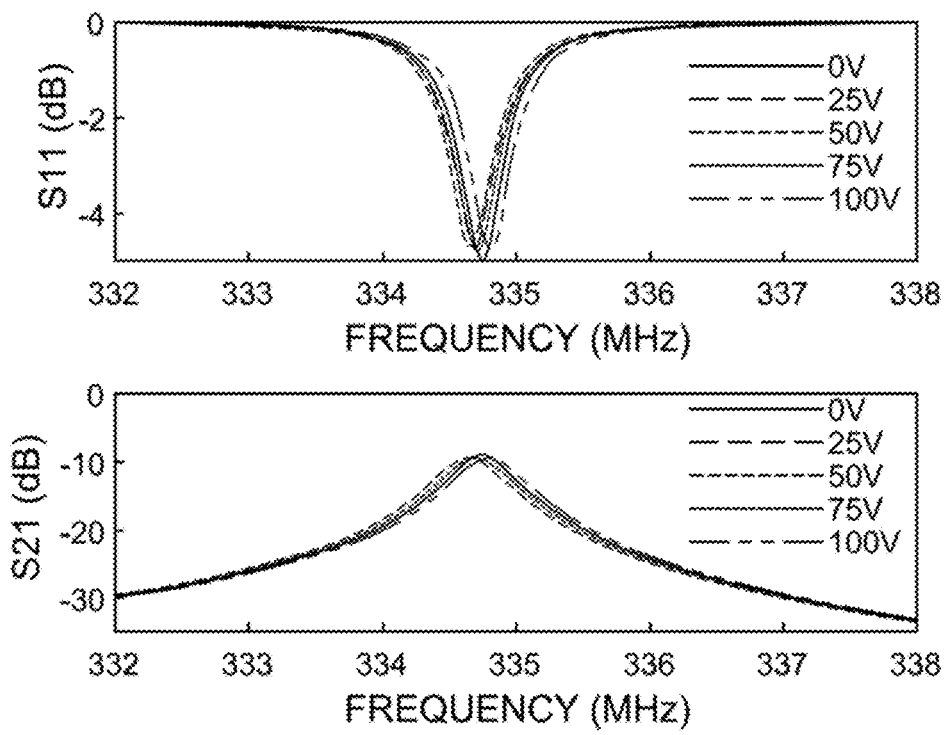
FIGS. 8A-8C show the solid-state tuning behavior via dc bias for $SH_0$ mode in an exemplary lithium niobate microresonator. Provided are graphs showing (A) measured performance when the dc polarity was S1(−V)/S2(+V) with a negligible tuning effect; (B) measured performance when the dc polarity was S1(+V)/S2(−V); and (C) center frequency and insertion loss dependence on the dc bias voltage, defined as the voltage drop from S1 to S2.
Figure 8B:
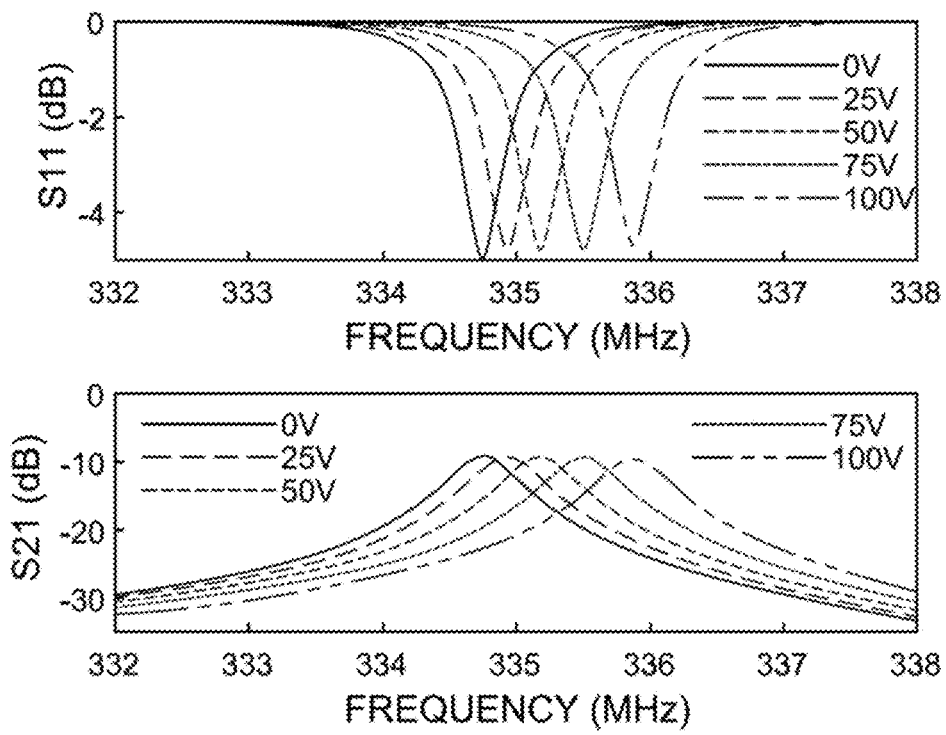
Figure 8C:
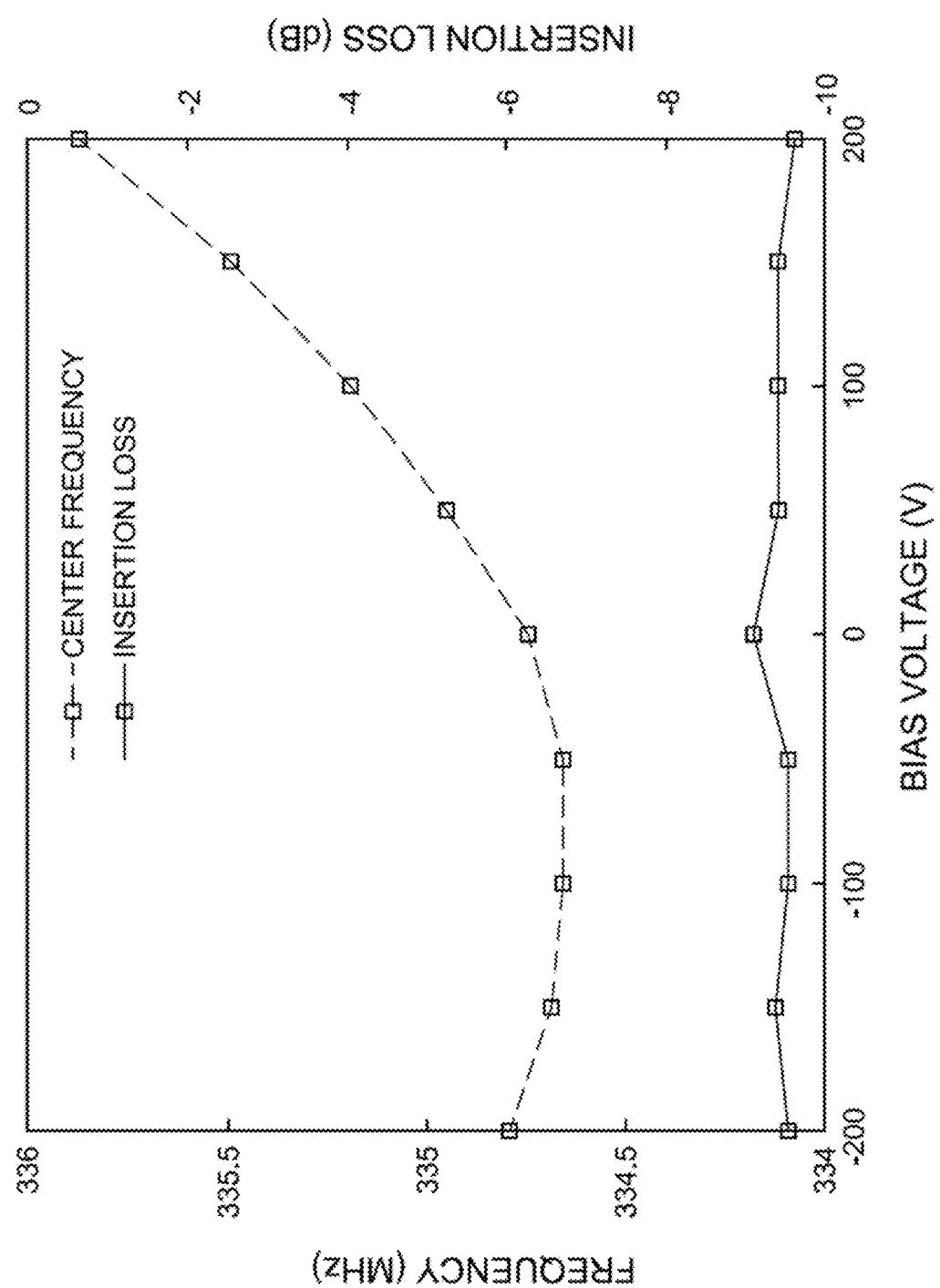

When the $SH_0$ mode LiNbO$_3$ resonators were biased using a polarity of S1(−V)/S2(+V) there was a negligible shift in the resonant frequency (FIG. 8A). The applied dc bias was either +100V/−100V or −100V/+100V for a total of 200V across a 2 µm gap. The dc electric field was always parallel to the X-cut (90°, 90°, 170°) acoustic propagation direction or −10° from the +Y-axis. Under these conditions, the insertion loss (IL) increased by 0.2 dB. However, when the dc bias was reversed to S1(+V)/S2(−V), a frequency shift of 1.2 MHz was observed (FIG. 8B). The frequency shift corresponded to a shift of 6 kHz/V or about 0.4% of tuning. The simulated value of the controlling coefficient for the $SH_0$ mode was $\alpha=\pm3.7\cdot10^{-11}$ m/V at (90°, 90°, $\psi=170°$), which gives $\alpha\cdot E=(3.7\cdot10^{-11}$ m/V$)\cdot(1\cdot10^8$ V/m$)=0.37\%$. The simulation and measurement were found to be in very close agreement. The applied electric field was $2.5\cdot10^7$ V/m to $1\cdot10^8$ V/m due to the 2 µm gap between the interdigital electrodes. For comparison, the electrical breakdown voltage of lithium niobate for interdigital electrodes with gaps around 3 µm is $\sim2.0\cdot10^8$ V/m,[33] where the maximum applied electric field used in the study was about 50% of the reported maximum breakdown value.

The observed tuning effect was asymmetrical around a zero dc bias, that is a polarity of S1(−V)/S2(+V) produced very little frequency shift with only a slight increase in the IL. In contrast, the IL increased by 0.5 dB at 200 V bias for the S1(+V)/S2(−V) polarity. Asymmetrical tuning was not entirely unexpected because the electrostrictive strain is not always quadratic with the electric field, especially in high permittivity materials with nonlinear electric field (E) and polarization vectors (P). The observed tuning behavior was in contrast with linear piezoelectricity where reversing the direction of the electric field would cause a change in the sign of the strain and hence the frequency shift would be $\pm\Delta f$. In the case of the nonlinear acoustic theory, it did not predict the measured tuning asymmetry for the $SH_0$ mode possibly due to mechanical bias from tensile stress in the device, however, further studies are needed. The exact tuning mechanism is not well understood, since electrostriction causes displacement thus it works against the elastic stiffness, where third order piezoelectricity tends to add to the elastic stiffness. A symbolic expansion of the tensor coefficients in eq. (7) could provide insight into which components drive the tuning mechanism.

Overall, in the presence of a dc bias field in thin plates of X-cut lithium niobate (h/λ~0.1), the effective material constants depend on the nonlinear third-order material constants. An applied dc bias caused an asymmetric frequency tuning effect in the acoustic resonators. The theoretical calculations of the controlling coefficient predict optimal values of electrical tuning at (90°, 90°, 0°) and (90°, 90°, 174°) for the $SH_0$ mode and (90°, 90°, 60°) for the $S_0$ mode.

Furthermore, the measured frequency tuning dependence for the $SH_0$ mode was 6 kHz/V with a maximum tuning range of 0.4%. The experimental measurements were in excellent agreement with the simulated value of the controlling coefficient of 0.37% for the $SH_0$ mode. The $SH_0$ mode tuning had an asymmetrical behavior, which was not predicted by the simulations. It is possible that the tuning asymmetry was due to pre-existing tensile stress in the device. For the $S_0$ mode at $\psi=60°$, the theory predicts a four-fold larger tuning of $\Delta v/v=1.6\%$. Solid-state tuning is a property of great interest for tunable RF building blocks in mobile systems. Additional lithium niobate cuts may provide more noteworthy results if the polarization can be maximized along a specific bias direction.

OTHER EMBODIMENTS

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

What is claimed is:

1. A device comprising:
   a microresonator characterized by a first resonant frequency, the microresonator comprising:
      a resonating portion that comprises a piezoelectric material, the piezoelectric material having an acoustic wave propagating therein;
      a support structure, and
      an acoustic isolation element, wherein the resonating portion is embedded in the acoustic isolation element such that the acoustic isolation element is disposed between the resonating portion and the support structure; and
   one or more first electrodes configured to apply an electrical bias to the resonating portion, thereby shifting the first resonant frequency to a second resonant frequency that is different than the first resonant frequency.

2. The device of claim 1, wherein the one or more first electrodes are further configured to provide the acoustic wave such that the acoustic wave has a first propagation direction in the piezoelectric material, wherein the electrical bias comprises an electric field that is oriented at angle between about 0.1° and about 20° with respect to the first propagation direction.

3. The device of claim 1, wherein the resonating portion and the support structure are composed of a single crystal piezoelectric element.

4. The device of claim 1, wherein the microresonator further comprises:
   one or more second electrodes configured to provide the acoustic wave such that the acoustic wave has a first propagation direction in the piezoelectric material, wherein the electrical bias comprises an electric field that is oriented at an angle between about 0.1° and about 20° with respect to the first propagation direction.

5. The device of claim 4, wherein the one or more first and/or second electrodes are located on a top surface and/or a bottom surface of the piezoelectric material.

6. The device of claim 1, wherein the acoustic isolation element is composed of silicon.

7. The device of claim 1, wherein the resonating portion comprises a crystal having a cut characterized by a maximum value of a controlling coefficient and a maximum value of an electromechanical coupling coefficient, as compared to other cuts of the crystal.

8. The device of claim 1, wherein the cut is an X-cut, a Y-cut, or a Z-cut of the crystal.

9. A tunable device comprising:
   a resonating portion comprising a piezoelectric material, the resonating portion having an electrical bias applied thereto;
   a support structure disposed below the resonating portion, wherein the resonating portion and the support structure are composed of a single crystal;
   a plurality of anchoring regions configured to suspend the resonating portion within the support structure, wherein a trench is disposed below and around the resonating portion; and
   one or more electrodes disposed in proximity to the resonating portion, wherein the one or more electrodes provides an acoustic wave having a first propagation direction in the piezoelectric material, wherein the electrical bias comprises an electric field that is oriented at an angle between about 0.1° and about 20° with respect to the first propagation direction.

10. The device of claim 9, wherein the electrical bias is configured to change a resonant frequency of the device upon changing an amount of electrical bias.

11. The device of claim 9, wherein the piezoelectric material has a thickness of from about 0.3 μm to about 10 μm.

12. The device of claim 9, wherein the single crystal comprises X-cut, Y-cut, or Z-cut lithium niobate or lithium tantalate.

13. The device of claim 12, wherein the single crystal is composed of lithium niobate.

14. The device of claim 9, wherein the resonating portion comprises a plate suspended over the trench.

15. The device of claim 9, wherein the plurality of anchoring regions formed from the same single crystal as the resonating portion and the support structure.

16. The device of claim 9, wherein the single crystal has a cut that is characterized by a maximum value of a controlling coefficient α and a maximum value of an electromechanical coupling coefficient $K^2$, as compared to other cuts of the single crystal.

17. The device of claim 16, wherein an absolute value of the controlling coefficient α is of from about $2 \cdot 10^{-11}$ m/V to about $15 \cdot 10^{-11}$ m/V.

18. The device of claim 16, wherein the electromechanical coupling coefficient $K^2$ is of from about 10% to about 50%.

19. A method of designing a tunable resonator, the method comprising:
   determining a controlling coefficient α and an electromechanical coupling coefficient $K^2$ for a plurality of propagation directions for an acoustic wave in a single crystal;
   locating a first propagation direction comprising a maximum value of the controlling coefficient α and/or the electromechanical coupling coefficient $K^2$;
   fabricating a resonator comprising a resonating portion and one or more electrodes disposed on a surface of the resonating portion, wherein the resonating portion comprises a crystal cut configured to promote an acoustic wave to propagate along the first propagation direction; and applying an electrical bias by way of the one or more electrodes, wherein the electrical bias comprises an electric field that is oriented at an angle of between about 0.1° and about 20° with respect to the first propagation direction.

20. The method of claim 19, wherein the single crystal comprises lithium niobate and/or lithium tantalite.

* * * * *